(12) United States Patent
Cheng et al.

(10) Patent No.: US 8,336,003 B2
(45) Date of Patent: Dec. 18, 2012

(54) METHOD FOR DESIGNING OPTICAL LITHOGRAPHY MASKS FOR DIRECTED SELF-ASSEMBLY

(75) Inventors: Joy Cheng, San Jose, CA (US); Kafai Lai, Poughkeepsie, NY (US); Wai-Kin Li, Beacon, NY (US); Young-Hye Na, San Jose, CA (US); Jed Walter Pitera, Portola Valley, CA (US); Charles Thomas Rettner, San Jose, CA (US); Daniel Paul Sanders, San Jose, CA (US); Da Yang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 304 days.

(21) Appl. No.: 12/708,570

(22) Filed: Feb. 19, 2010

(65) Prior Publication Data
US 2011/0209106 A1 Aug. 25, 2011

(51) Int. Cl.
*G06F 17/50* (2006.01)
(52) U.S. Cl. .............................. 716/53; 716/50; 716/55
(58) Field of Classification Search .................... 716/50, 716/55, 53
See application file for complete search history.

(56) References Cited

U.S. PATENT DOCUMENTS

| | | | |
|---|---|---|---|
| 6,578,190 B2 | 6/2003 | Ferguson et al. | |
| 6,617,083 B2 | 9/2003 | Usui et al. | |
| 6,631,511 B2 | 10/2003 | Haffner et al. | |
| 6,721,938 B2 | 4/2004 | Pierrat et al. | |
| 6,904,587 B2 | 6/2005 | Tsai et al. | |
| 7,309,658 B2 | 12/2007 | Lazovsky et al. | |
| 7,488,933 B2 | 2/2009 | Ye et al. | |
| 7,553,760 B2 | 6/2009 | Yang et al. | |
| 7,592,247 B2 | 9/2009 | Yang et al. | |
| 7,721,242 B2 * | 5/2010 | Hyde et al. ..................... | 716/126 |
| 2009/0089736 A1 | 4/2009 | Huang et al. | |
| 2009/0146259 A1* | 6/2009 | Jessen et al. .................. | 257/618 |
| 2009/0196488 A1* | 8/2009 | Nealey et al. ................. | 382/145 |
| 2009/0239177 A1 | 9/2009 | Mashita et al. | |
| 2010/0064270 A1* | 3/2010 | Aguado Granados et al. ... | 716/5 |
| 2011/0200795 A1* | 8/2011 | Lammers et al. .......... | 428/195.1 |

OTHER PUBLICATIONS

Chou et al; Lithographically induced self-assembly of periodic polymer micropillar arrays; J. Vac. Sci. Technol. B 17 (6), Nov./Dec. 1999; pp. 3197-3202.
Stephen Y. Chou; Nanoimprint Lithography and Lithographically Induced Self-Assembly; MRS Bulletin/ Jul. 2001; pp. 512-517.

* cited by examiner

*Primary Examiner* — Stacy Whitmore
*Assistant Examiner* — Magid Dimyan
(74) *Attorney, Agent, or Firm* — Schmeiser, Olsen & Watts

(57) ABSTRACT

A method and a computer system for designing an optical photomask for forming a prepattern opening in a photoresist layer on a substrate wherein the photoresist layer and the prepattern opening are coated with a self-assembly material that undergoes directed self-assembly to form a directed self-assembly pattern. The methods includes: generating a mask design shape from a target design shape; generating a sub-resolution assist feature design shape based on the mask design shape; using a computer to generate a prepattern shape based on the sub-resolution assist feature design shape; and using a computer to evaluate if a directed self-assembly pattern of the self-assembly material based on the prepattern shape is within specified ranges of dimensional and positional targets of the target design shape on the substrate.

18 Claims, 14 Drawing Sheets

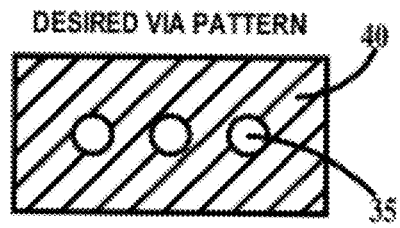
FIG. 3A
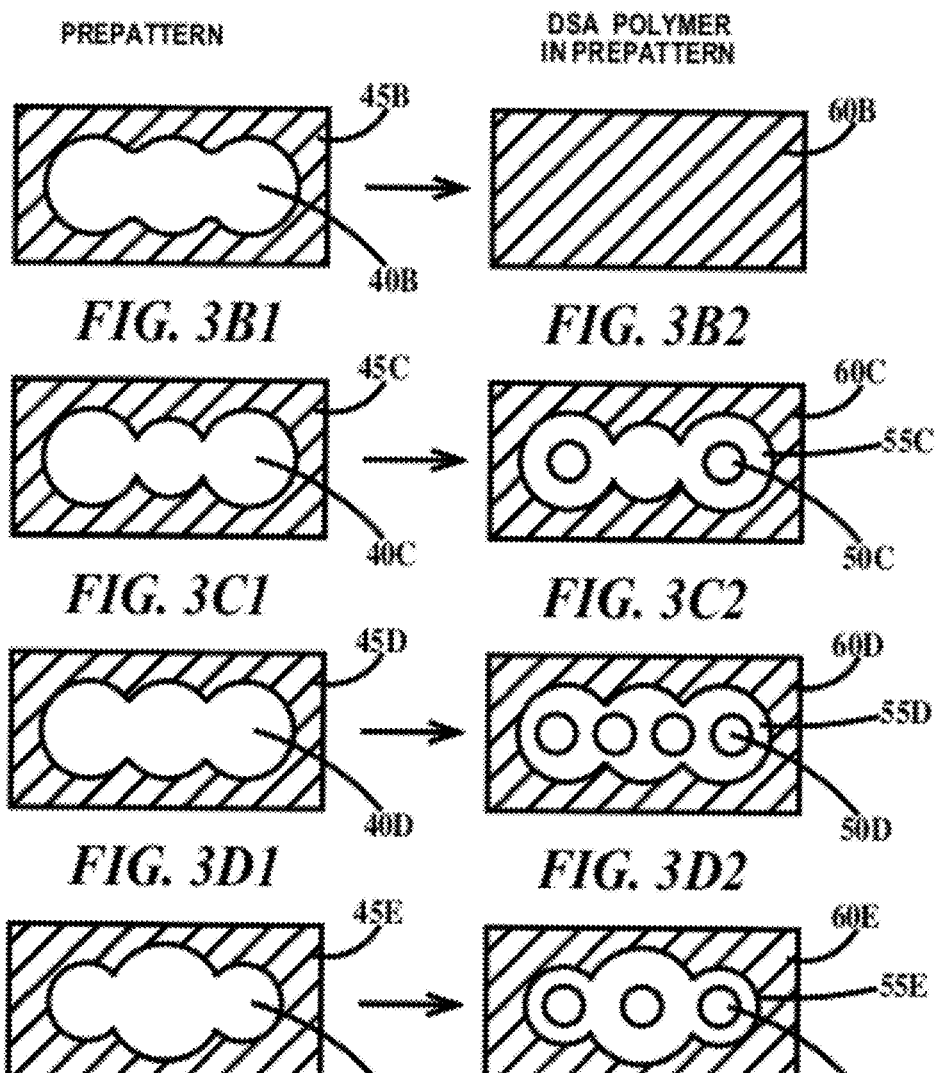
FIG. 3B1  FIG. 3B2
FIG. 3C1  FIG. 3C2
FIG. 3D1  FIG. 3D2
FIG. 3E1  FIG. 3E2

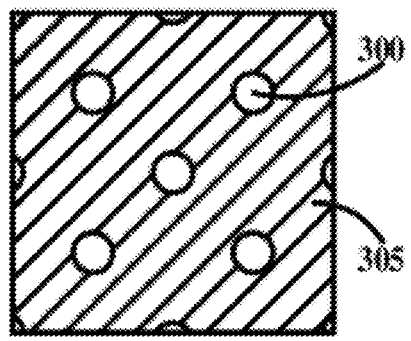
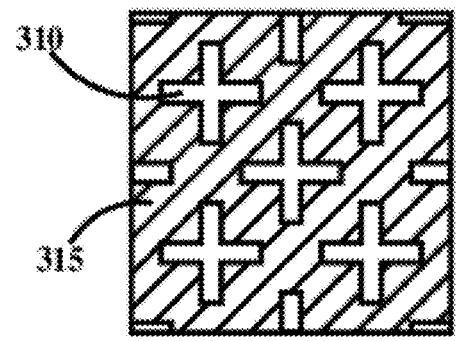
*FIG. 8*     *FIG. 8A*
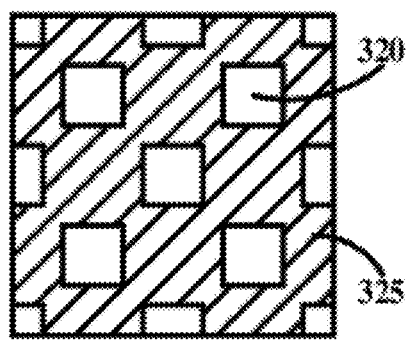
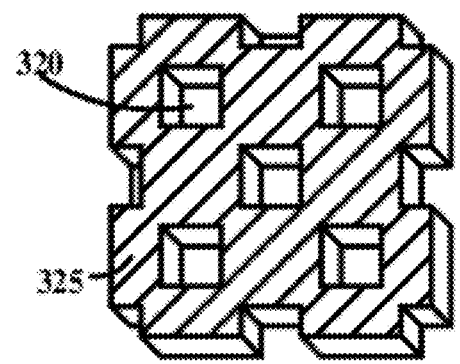
*FIG. 8B*     *FIG. 8C*
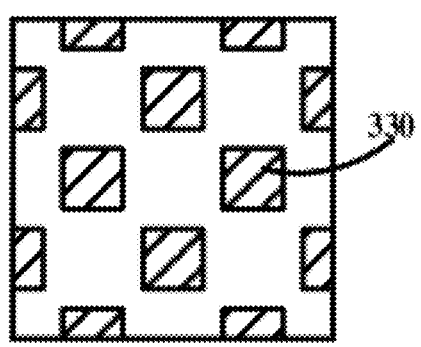
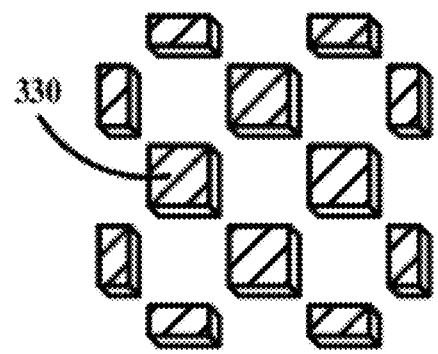
*FIG. 8D*     *FIG. 8E*

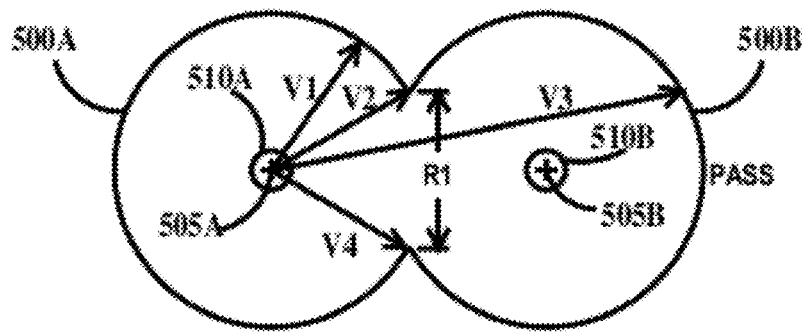
*FIG. 11A1*
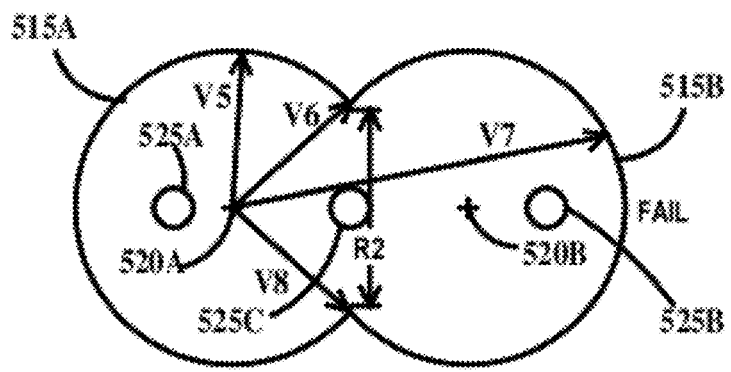
*FIG. 11A2*
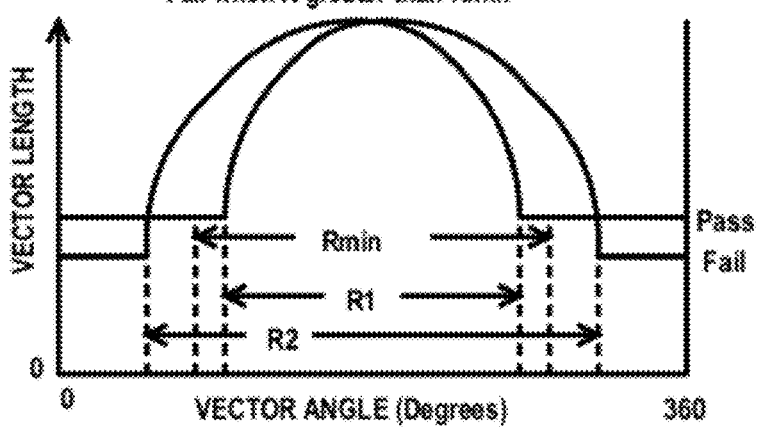
*FIG. 11A3*

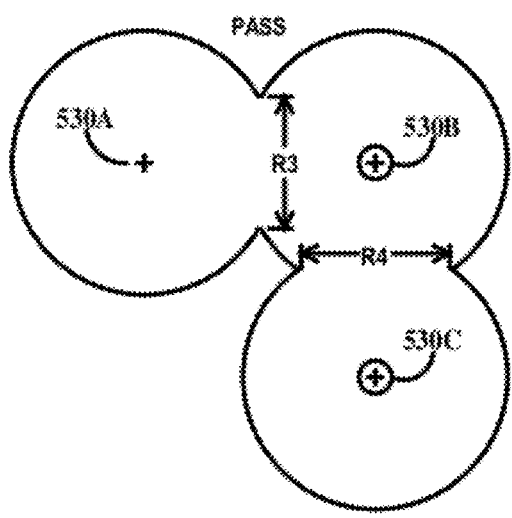
*FIG. 11B1*
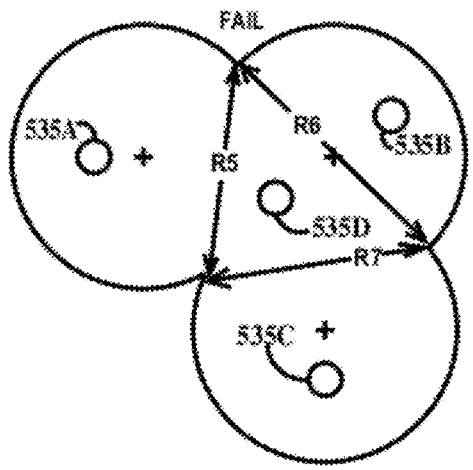
*FIG. 11B2*
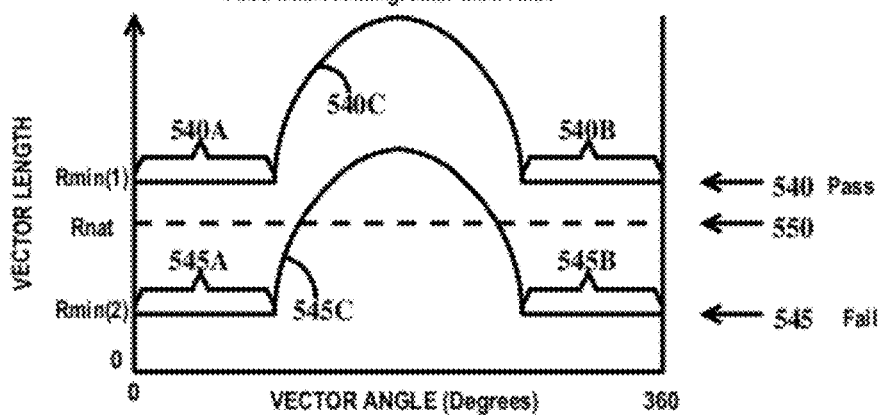
*FIG. 11C*

METHOD FOR DESIGNING OPTICAL LITHOGRAPHY MASKS FOR DIRECTED SELF-ASSEMBLY

FIELD OF THE INVENTION

The present invention relates to the field of integrated circuit fabrication; more specifically, it relates to a method and computer system for designing optical lithography masks for directed self-assembly materials.

BACKGROUND

The economics of semiconductor fabrication dictates that devices need to be scaled by approximately 70% in linear dimensions every 18-24 months in order to maintain cost effectiveness. Optical lithography has been the driving force for scaling; however, 193 nm immersion lithography approaches its physical resolution limit at about 22 nm. Beyond 22 nm, it is difficult to generate desired patterns using optical lithography. Directed self-assembly (DSA), which combines self-assembling materials and a lithographically defined prepattern, is a potential candidate to extend optical lithography. A lithographically-defined prepattern encoded with spatial chemical and/or topographical information serves to direct the self-assembly process and the pattern formed by the self-assembling materials. The resolution enhancement and self-healing (self-error reduction) effect from DSA are particularly useful to extend the resolution of optical lithography and to rectify the ill-defined patterns printed by optical lithography. For example, the process window of printing via patterns can be increased by employing DSA. To take full advantage of DSA for extending optical lithography requires careful design of the prepattern and the design of the photomask used to form a prepattern on substrates. Such methodologies are currently lacking. Accordingly, there exists a need in the art to mitigate or eliminate the deficiencies and limitations described hereinabove.

SUMMARY

A first aspect of the present invention is a method of designing an optical photomask for forming a prepattern opening in a photoresist layer on a substrate wherein the photoresist layer and the prepattern opening are coated with a self-assembly material that undergoes directed self-assembly to form a directed self-assembly pattern, comprising: (a) generating a mask design shape from a target design shape; (b) generating a sub-resolution assist feature design shape based on the mask design shape; (c) using a computer to generate a prepattern shape based on the sub-resolution assist feature design shape; and (d) using a computer to evaluate if a directed self-assembly pattern of the self-assembly material based on the prepattern shape is within specified ranges of dimensional and positional targets of the target design shape on the substrate.

A second aspect of the present invention is a method for selecting at least one prepattern shape of from a plurality of prepattern shapes, which, when used in conjunction with a multi-component self-assembly material, generates a directed self-assembly pattern over a substrate, comprising: applying a first test to each prepattern shape of the plurality of prepattern shapes to determine a fidelity with which each prepattern shape of the plurality of prepattern shapes produces the directed self-assembly pattern when used in conjunction with a directed self-assembly process using the multi-component self-assembly material; applying a second test to each prepattern shape of the plurality of prepattern shapes to determine a lithographic exposure latitude for each prepattern shape of the plurality of prepattern shapes; and selecting the at least one prepattern shape of the plurality of prepattern shapes based on evaluating results of the first and second tests.

A third aspect of the present invention is a computer system comprising a processor, an address/data bus coupled to the processor, and a computer-readable memory unit coupled to communicate with the processor, the memory unit containing instructions that when executed by the processor implement a method for designing an optical photomask for forming a prepattern opening in a photoresist layer on a substrate wherein the photoresist layer and the prepattern opening are coated with a self-assembly material that undergoes directed self-assembly to form a directed self-assembly pattern, the method comprising the computer implemented steps of: (a) generating a mask design shape from a target design shape; (b) generating a sub-resolution assist feature design shape based on the mask design shape; (c) generating a prepattern shape based on the sub-resolution assist feature design shape; and (d) evaluating if a directed self-assembly pattern of the self-assembly material based on the prepattern shape is within specified ranges of dimensional and positional targets of the target design shape on the substrate.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIGS. 3A, 3B1, 3B2, 3C1, 3C2, 3D1, 3D2, 3E1 and 3E2 illustrate the effect of prepattern geometry on DSA patterns;

FIGS. 8, 8A, 8B, 8C, 8D and 8E illustrate integrating DSA process characteristics into a mask design for forming sub-resolution features using directed self-assembly and optical lithography for step 2 of FIG. 7;

FIGS. 11A1, 11A2, 11A3 illustrate the principle of minimum radius of the first algorithm for DSA pattern simulation and testing of FIG. 10A;

FIGS. 11B1 and 11B2 illustrate the principle of minimum radius of the first algorithm for DSA pattern simulation and testing of FIG. 10A extended to three vias in an "L" shape;

FIG. 11C illustrates the principle of natural radius of the first algorithm for DSA pattern simulation and testing of FIG. 10A;

DETAILED DESCRIPTION

The geometry of the prepattern is a critical factor to determine the morphology, dimension and position of vias formed using DSA processes. Block copolymers, which phase separate into nanoscale chemically-different domains, are examples of self-assembly materials used in DSA processes. Combining self-assembly block copolymers with a topographical prepattern, DSA via patterns can be formed within the topographical prepattern. DSA can reduce the via size in a lithographically defined prepattern (see FIGS. 1A through 1C). In addition, the DSA process can reduce the percentage variation in critical dimension (CD) (i.e., the diameter of the via) of the prepattern (see FIG. 2A) and can split merged prepattern vias into discrete vias (see FIG. 2B). Further, the DSA process can produce sub-resolution features such as sub-resolution vias. Sub-resolution features are defined as features that are smaller than what can be printed precisely (in size and position) by the optical lithography tool. A method enabling optical lithography to print prepatterns, which are capable of precisely directing polymer self-assembly of a DSA via to match a via design target, is highly desirable. The embodiments of the present invention describe a new method which iteratively incorporates optical-proximity correction (OPC) principles and knowledge of the DSA process into photomask design. Certain embodiments of the present invention describe a full-chip OPC flow that allows optimized DSA via prepatterns to be printed using an optical lithography tool.

Under the right conditions, block copolymers (BCP) phase separate into micro-domains (also known as "microphase-separated domains" or "domains") to reduce the total free energy, and in the self-assembly process, nanoscale features of dissimilar chemical composition are formed.

A di-block copolymer has blocks of two different polymers. A formula (1) representative of a di-block copolymer is shown below:

$$-(A)_m-(B)_n- \quad (1)$$

in which the subscripts "m" and "n" represent the number of repeating units of A and B, respectively. The notation for a di-block copolymer may be abbreviated as A-b-B, where A represents the block copolymer of the first block, B represents the block copolymer of the second block, and -b- denotes that it is a di-block copolymer of blocks of A and B. For example, PS-b-PMMA represents a di-block copolymer of polystyrene (PS) and polymethylmethacrylate (PMMA).

While di-block copolymers are used in the description of the present invention, the invention is not limited to di-block copolymers but may include other block copolymers as well as other materials that will self assemble into inner and outer domains having dissimilar chemical structures and/or chemical properties.

Figure 1A:
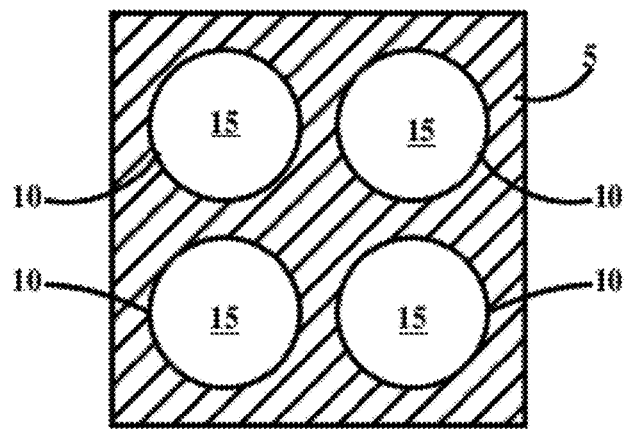
FIGS. 1A, 1B and 1C illustrate an exemplary DSA process for forming vias.
Figure 1B:
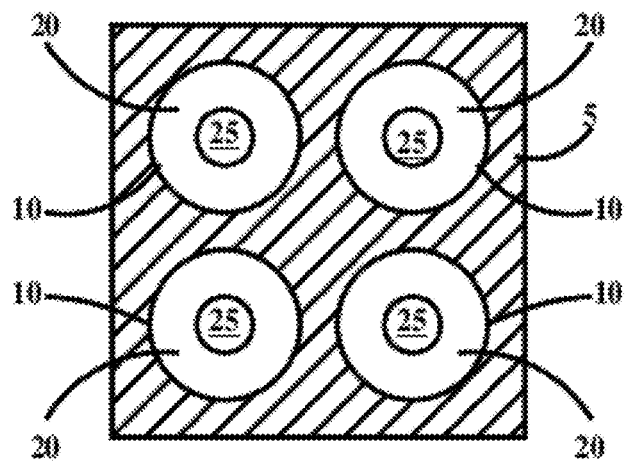
Figure 1C:
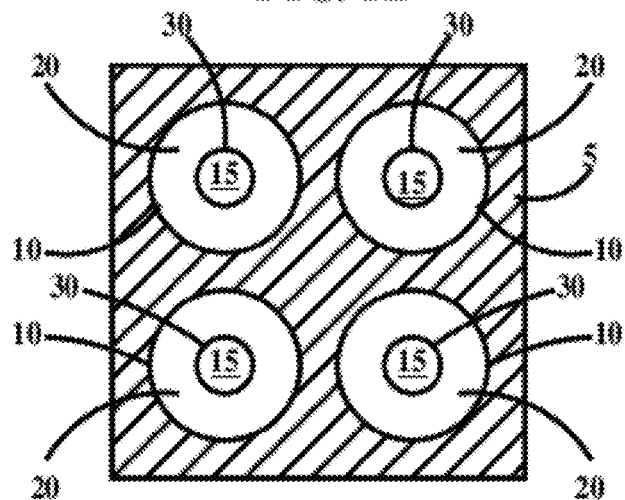

FIGS. 1A, 1B and 1C illustrate an exemplary DSA process for forming vias. In FIG. 1A, a photoresist layer 5 having openings 10 has been formed on a substrate 15. (The term "substrate" is used broadly to mean any physical structure suitable for use with any of the methods described herein, including but not necessarily limited to substrates used in the semiconductor industry.) For the sake of clarity, only four openings 15 are shown in FIG. 1A, although in practice, many more openings would typically be used, e.g., hundreds, thousands, or even more.

In FIG. 1B, a directed self-assembly (DSA) formulation containing a block copolymer is coated over photoresist layer 5, filling openings 10. Over each opening 10, the block copolymer phase separates into outer domains 20 and inner domains 25, with a single domain 25 being surrounded by a single domain 20 in a plan view. FIG. 1B is not an exact description of the phase-separation process, but describes the domains germane to the invention. Depending upon the type of block copolymer used, this self-assembly can occur spontaneously or be induced (e.g., as a result of an annealing process).

In FIG. 1C, domains 25 are selectively removed to form openings 30 that can then be transferred to the underlying substrate 15, thereby forming a pattern of via/contact holes. A via is a hole that is filled with an electrical conductor connecting adjacent wiring levels of an integrated circuit. A contact is a hole filled with an electrical conductor connecting a device (e.g., field effect transistor) and an adjacent wiring level of an integrated circuit. Domains 25 may be removed, for example, by using a development process (such as developing them in aqueous base developer), by dissolving them in solvent, or by etching them away with a plasma. The process selectively removes domains 25 while leaving behind domains 20. Openings 30 are smaller than openings 10 of FIG. 1A. The morphology, dimension, and position of self-assembly domains in the prepatterns and the resulting DSA vias may be modeled and included in a method of designing the mask to generate proper prepattern for DSA vias.

Figure 2A:
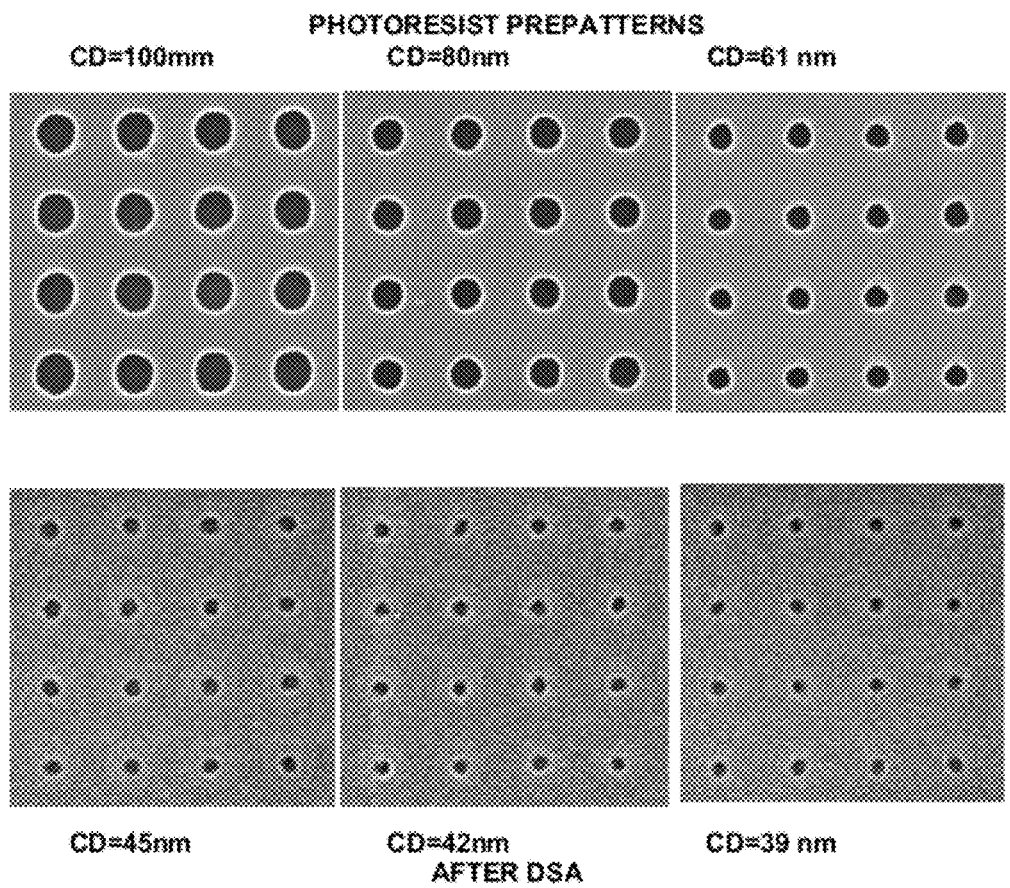
FIG. 2A includes a set of scanning electron microscopy (SEM) micrographs of photoresist prepatterns (top row) and corresponding openings (bottom row) after DSA processing using the prepatterns.

FIG. 2A includes a set of SEM micrographs of photoresist prepatterns (top row) and corresponding openings (bottom row) after DSA processing using the prepatterns. The top row of FIG. 2A shows a hardened 193 nm resist (JSR 2073) prepattern having openings of average (50 to 100 measured openings of each size) diameters 100 nm, 80 nm and 61 nm formed on a substrate. These openings are analogous to openings 10 of FIG. 1A. The ΔCD of the photoresist prepatterns openings was 39 nm and the % ΔCD of the photoresist prepatterns openings was 49%.

Next, a layer of a di-block copolymer of polystyrene (PS) and polymethylmethacrylate (PMMA) (PS-b-PMMA, 96 kg/mol-35 kg/mol) was spun-cast on the photoresist and was baked at 200° C. for 5 minutes, and the block copolymer self-assembled into an outer PS domain (corresponding to region 20 of FIG. 1B) surrounding an inner domain of PMMA (corresponding to region 25 of FIG. 1B). The PMMA domains were removed by oxygen plasma to generate openings (corresponding to openings 30 of FIG. 1C) in which the substrate was exposed. The resultant openings had diameters of 45 nm, 42 nm and 39 nm. The ΔCD of the etched openings was 6 nm and the % ΔCD of the etched openings was 14%. The percentage CD variation of DSA vias, 14%, is greatly reduced from the percentage CD variation of prepattern openings, 49%. This decreased variation arises from the chemical structure of the DSA material, which produces a preferred uniform size in the inner domains.

Another advantage DSA processing offers is the elimination of merged vias. An experimental example of pattern correction capability using segmented prepatterns is shown in FIG. 2B.

Figure 2B:
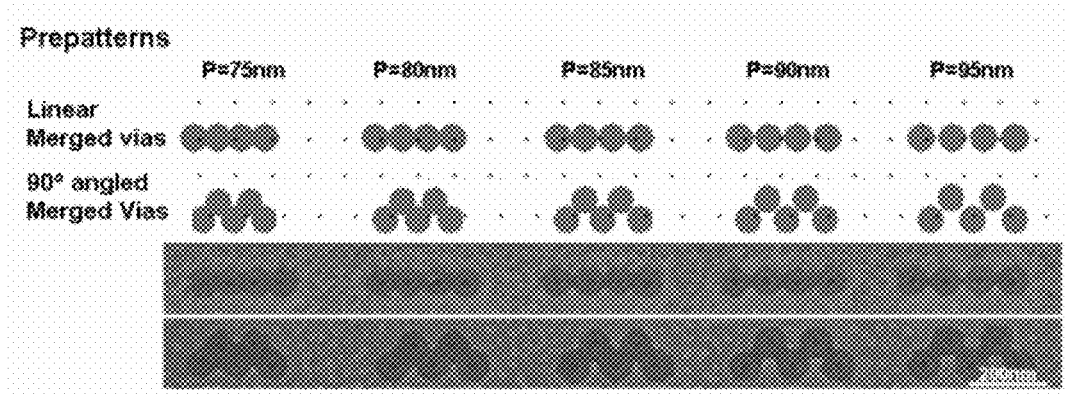
FIG. 2B includes schematic representations of linear and angled prepatterns and SEM micrographs of corresponding DSA patterns in the prepatterns.

FIG. 2B includes schematic representations of linear and angled prepatterns and SEM micrographs of corresponding DSA patterns in the prepatterns. FIG. 2B shows schematic representations of linear and angled prepatterns (first and second rows from top) and SEM images (third and fourth rows from top) of corresponding DSA vias in which their pitch (the distance between the geometric centers of adjacent domains) is varied from 75 nm to 95 nm in 5 nm increments (going from left to right). A blend of PS-b-PMMA (68 kg/mole-34 kg/mole) and PS (22 kg/mole) was coated on the segmented prepatterns and baked to form self-assembled PS and PMMA domains over each semi-enclosure. The DSA vias were formed by selectively removing PMMA with acetic acid. The third from top row of FIG. 2B shows these domains arranged along an axis, whereas the fourth from top row of FIG. 2B shows that consecutive self-assembly holes can form a saw-tooth pattern (defined by imaginary line segments arranged at 90 degrees to each other). A DSA process used with a segmented prepattern results in discrete, well-positioned DSA vias. Therefore, with segmented prepattern geometry, DSA can be used to produce arrays of holes having a hole density that is higher than the density of discrete holes written by optical lithography methods, while achieving precise alignment registration, even for holes that are arbitrarily arranged.

Figure 5A:
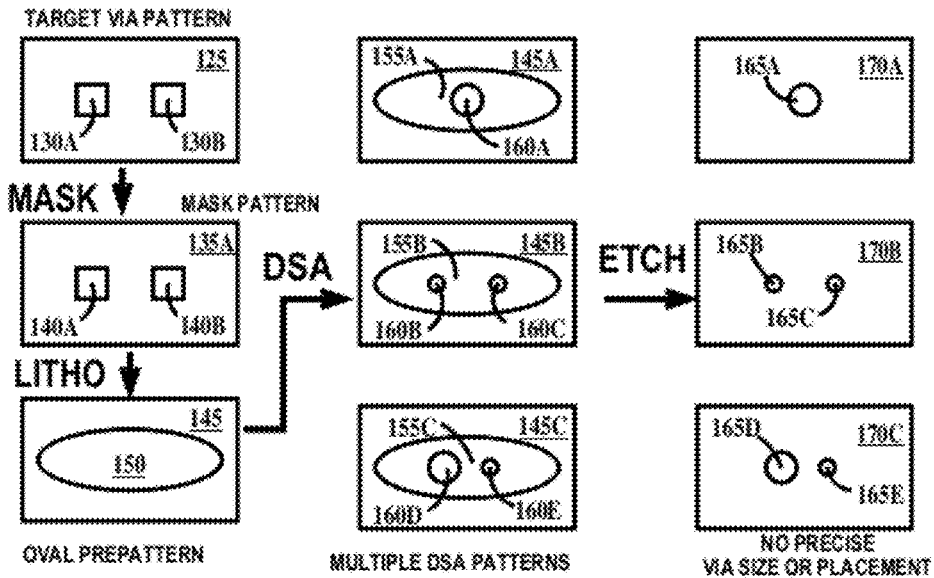
FIG. 5A illustrates that an oval prepattern results in a lack of precise via size and placement in the DSA pattern and the etched vias.
Figure 5B:
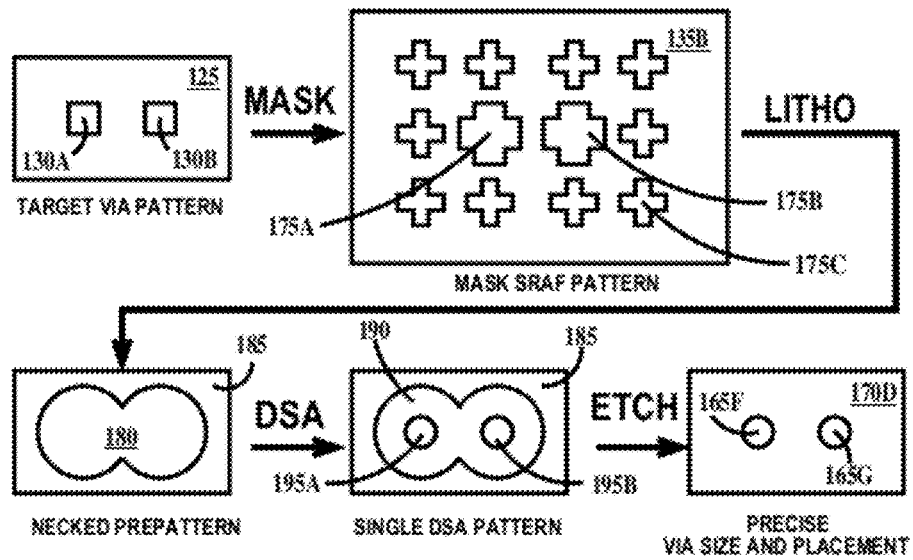
FIG. 5B illustrates precise via size and via placement in the DSA pattern and etched vias that result using the methods of embodiment of the present invention.

Turning to FIGS. 5A and 5B, optical lithography using traditional photomask patterns tends to print an oval shape in the photoresist layer when the size and spacing (pitch) between images is too small to be fully resolved. These oval shaped prepatterns cannot precisely direct the self-assembly of the inner domains of the self-assembly block copolymer, which leads to various defects as illustrated in FIG. 5A. For example, only a single inner domain may be formed, inner domain sizes may vary, or the inner domain of may shift from the desired position. On the other hand, dumbbell shape prepatterns with sharp necking can effectively direct the position of inner self assembled domains to form a precise DSA configuration with high placement accuracy as illustrated in FIG. 5B.

FIG. 5A illustrates that an oval prepattern results in a lack of precise via size and placement (e.g., lack of fidelity) in the DSA pattern and the etched vias. In FIG. 5A, a target via pattern 125 includes vias 130A and 130B. Target via pattern 125 is used to fabricate a mask 135A having via images 140A and 140B. After photolithography a photoresist layer having an oval opening (a prepattern) 150 is formed. After forming a DSA pattern from a block copolymer over prepattern 150 a number of multiple DSA patterns can be formed. Worse, there are multiple prepatterns 150 and the DSA patterns are not all the same from prepattern to prepattern even though the shapes of the prepatterns were the same.

Three examples are given in FIG. 5A. In a first example, in a photoresist region 145A, an outer domain 155A surrounds a single inner domain 160A. After etching, a single via opening 165A is formed in a region of a layer 170A. In a second example, in a photoresist region 145B, an outer domain 155B surrounds two inner domains 160B and 160C. After etching, two via openings 165B and 165C are formed in a region of a layer 170B. In a third example, in a photoresist region 145C, an outer domain 155C surrounds two inner domains 160D and 160E. After etching, two via openings 165D and 165E are formed in a region of a layer 170C. Note the size of via opening 165A is correct, but its location is incorrect and there is only one opening when there should be two. The location of via openings 165B and 165C are correct but the sizes are incorrect (too small). The location of via openings 165D and 165E are correct and the size of via opening 165D is correct, but the size of via opening 165E is incorrect (too small).

FIG. 5B illustrates precise via size and via placement in the DSA pattern and etched vias that result using the methods of embodiment of the present invention. In FIG. 5B, target via pattern 125 includes vias 130A and 130B as in FIG. 5A. Target via pattern 125 is used to fabricate a mask 135B having sub-resolution assist features (SRAF) 175A, 175B and 175C. SRAFs 175A and 175B have sub-resolution corner notches and will print as prepattern 180. SRAFs 175C are completely sub-resolution and will not print at all. After photolithography a photoresist layer 185 having dumbbell shaped prepatterns 180 with defined necking regions is formed. After the DSA process, in photoresist region 185, an outer domain 190 surrounds each of first and second inner domains 195A and 195B. After etching, first and second via openings 165F and 165G are formed in a region of a layer 170D. The location and size of vias 165F and 165G are correct and all other via openings formed using other necked prepatterns 180 will be similar.

FIG. 5B applied the OPC concept of adjusting target feature shapes to generate mask shapes that print the original target feature shape in a photoresist layer to DSA processing. In DSA processing, OPC adjusts target feature shapes to generate mask shapes that print a prepattern shape in a photoresist layer. The prepattern shape results in a desired DSA pattern in a DSA material. To distinguish this type of OPC from conventional OPC which is used to print the target feature very closely, the terminology direct self-assembly optical proximity correction (DSAOPC) may be used.

A high throughput method to generate prepatterns capable of precisely directing the block copolymer self-assembly, thereby leading to vias, is highly desirable. A method capable of printing DSA via prepatterns using 193 nm conventional and immersion lithography is particularly useful. However, conventional computer-based methods for mask design, and optical proximity correction (OPC), aim for printing a specific resist profile very close to that of the target via shape. Therefore, standard mask design algorithms can neither generate optimized prepatterns for DSA nor maximize the advantages of DSA such as self-healing and pattern rectification. FIGS. 3A, 3B1, 3B2, 3C1, 3C2, 3D1, 3D2, 3E1 and 3E2 illustrate the effect of prepattern geometry on DSA patterns.

For example, a target via pattern may consist of three clear openings 35 in an opaque layer 40 as shown in FIG. 3A. The circuit designer may request the pattern of opening 40B in a prepattern layer 45B as shown in FIG. 3B1. However, prepattern 40B, which is a good DSA template, may be very difficult to print by optical lithography so no corresponding image (or a highly distorted image) is formed after exposure in photoresist layer 60B of FIG. 3B2. On the other hand, the prepatterns of FIGS. 3C1, 3D1 and 3E1 may be relatively easy to print using optical lithography. Applying a DSA model to the prepattern 40C of FIG. 3C1 will not produce an acceptable DSA pattern over the prepattern in photoresist layer 60D of FIG. 3C2, as only two openings 50C will be formed in block copolymer 55C whereas three are required. Applying a DSA model to the prepattern 40D of FIG. 3D1 will not produce an acceptable DSA pattern over the prepattern in photoresist layer 60C of FIG. 3D2, as four openings 50D will be formed in block copolymer 55D whereas only three are required. Applying a DSA model to the prepattern 40E of FIG. 3E1 will produce an acceptable DSA pattern over the prepattern in photoresist layer 60C of FIG. 3E2, as three openings 50E will be formed in block copolymer 55E and openings 50E are in the proper locations.

Thus only prepattern of FIG. 3E1 will both produce the target pattern of FIG. 3A and be printable using a reasonable range of exposures optical lithography. (Very short exposures are difficult to control and very long exposures reduce throughput.) The conventional OPC flow wherein the prepattern is predetermined by the circuit designer thus may fail frequently as described in this example due to lack of iterative co-optimization of OPC and DSA. The methods of the embodiments of the present invention generate a photomask that is optimized for both OPC and DSA.

Figure 4:
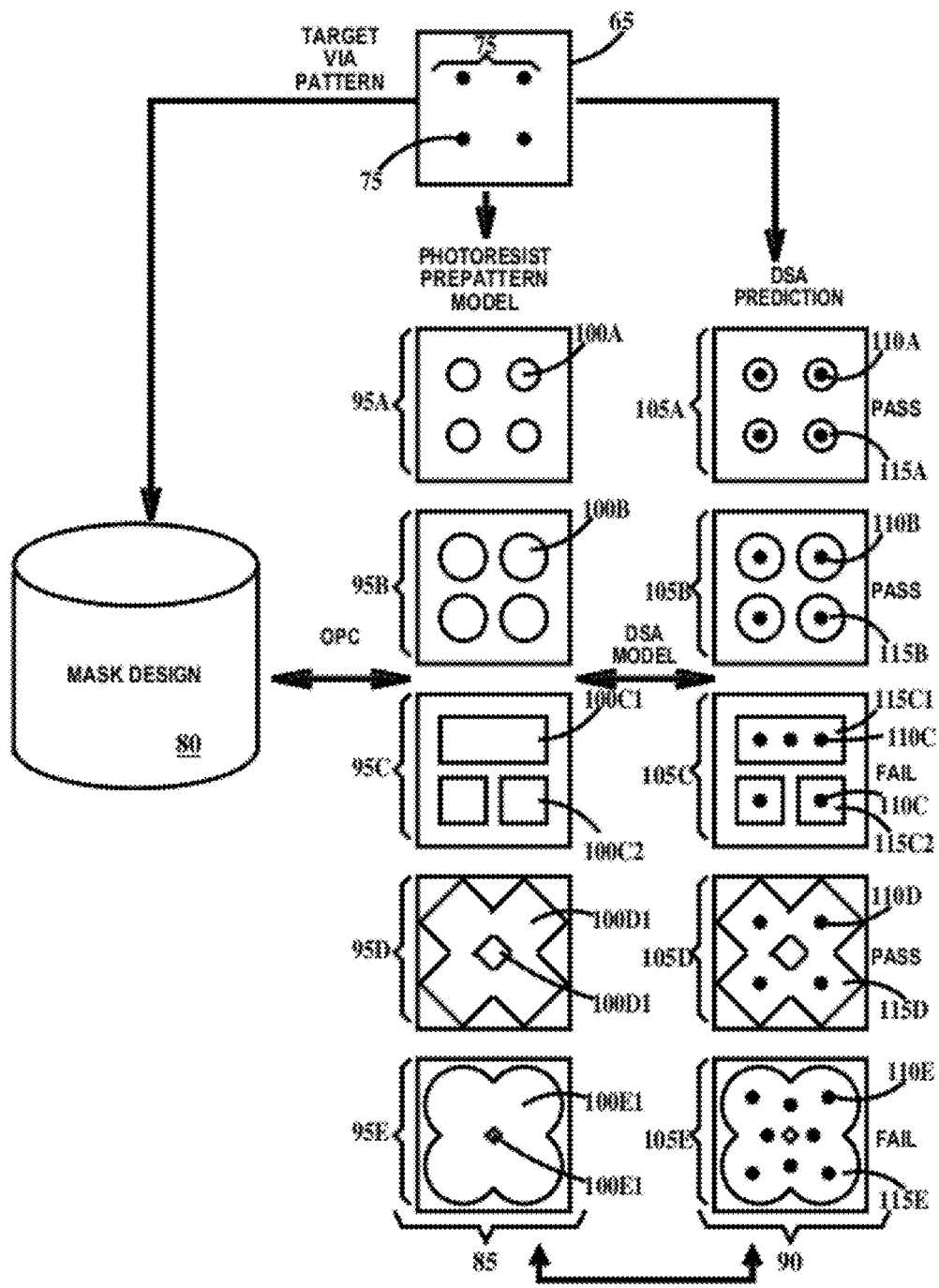
FIG. 4 illustrates an exemplary embodiment of a method for designing a photomask for sub-resolution via formation using DSA and optical photolithography according to an embodiment of the present invention.

FIG. 4 illustrates an exemplary embodiment of a method for designing a photomask for sub-resolution via formation using DSA and optical photolithography according to an embodiment of the present invention. The method comprises:

First, providing a target layout 65 (having an array 70 of via images 75) and supplying that design to a mask design data file, a photoresist prepattern model and a DSA model.

Second, on a computer, generating a prepattern model 85 (shown graphically, however, in practice shapes coded as digital data representing the shape and readable by mask design software and displayable graphically on a computer screen would be used) of a developed resist pattern corresponding to the description of the mask. Prepattern computer models and modeling is described infra. Five exemplary photoresist prepattern models are illustrated. Prepattern 95A comprises four discrete circular openings 100A. Prepattern 95B comprises four discrete circular openings 100B. Note openings 100B have a greater diameter than openings 100A. Prepattern 95D comprises a cross shaped opening 100D1 around a core 100D2. Prepattern 95E comprises a four merged circle opening 100E1 around a core 100E2.

Third, on a computer, generating a DSA prediction 90 (shown graphically, however, in practice shapes coded as digital data representing the shape and readable by mask design software and displayable graphically on a computer screen would be used) of a developed resist pattern corresponding to the description of the mask. DSA computer models and DSA prediction is described infra. Five exemplary DSA predictions are illustrated.

Prediction 105A comprises a DSA pattern of four discrete inner domains 110A surrounded by corresponding outer domains 115A. Examination of prediction 105A indicates that the corresponding prepattern 95A is acceptable (passes) since the size and locations of inner domains 110A correspond to the size and locations of via images 75.

Prediction 105B comprises a DSA pattern of four discrete inner domains 110B surrounded by corresponding outer domains 115B. Examination of prediction 105B indicates that the corresponding prepattern 95B is acceptable (passes) since the size and locations of inner domains 110B correspond to the size and locations of via images 75.

Prediction 105C comprises a DSA pattern of three discrete inner domains 110C surrounded by an outer domain 115C1 and two discrete inner domains 110C surrounded by corresponding outer domain 115C2. Examination of prediction 105C indicates that the corresponding prepattern 95C is not acceptable (fails) since there are five inner domains 110C but only four via images 75.

Prediction 105D comprises a DSA pattern of four discrete inner domains 110C surrounded by a cross-shaped outer domain 115D. Examination of prediction 105D indicates that the corresponding prepattern 95D is acceptable (passes) since the size and locations of inner domains 110D correspond to the size and locations of via images 75.

Prediction 105E comprises a DSA pattern of eight discrete inner domains 110E surrounded by an outer domain 115E. Examination of prediction 105E indicates that the corresponding prepattern 95E is not acceptable (fails) since there are eight inner domains 110E but only four via images 75.

Fourth, after DSA prediction software running on a computer is used to determine whether the DSA pattern resulting from the corresponding photoresist prepattern yields a DSA pattern that is sufficiently close or of sufficient fidelity (e.g., with a predetermined range of inner domain size and location compared to target via sizes and locations) to the target pattern to within an acceptable overlay error, and if not, then iteratively modifying the mask design and repeating the second and third steps until a pattern is achieved to within an acceptable degree of fidelity to the target pattern or a predetermined number of iterations have been performed. Optionally, if the fidelity of the resulting DSA vias from specific self-assembling (SA) materials is not sufficient, the composition of the SA material may be iteratively changed and, without changing the prepattern, the fidelity of resulting DSA pattern predicted.

Fifth, if there are multiple prepatterns that are sufficiently close in the fourth step, the prepattern that (i) results in a lower mask error enhancement factor (MEEF) and higher exposure latitude and (ii) provides larger error tolerance for the DSA process is chosen. MEEF is the ratio of the CD range on the wafer and the expected CD range due to the mask. It indicates that mask CD errors are in effect magnified during the optical transfer to the wafer.

Figure 6:
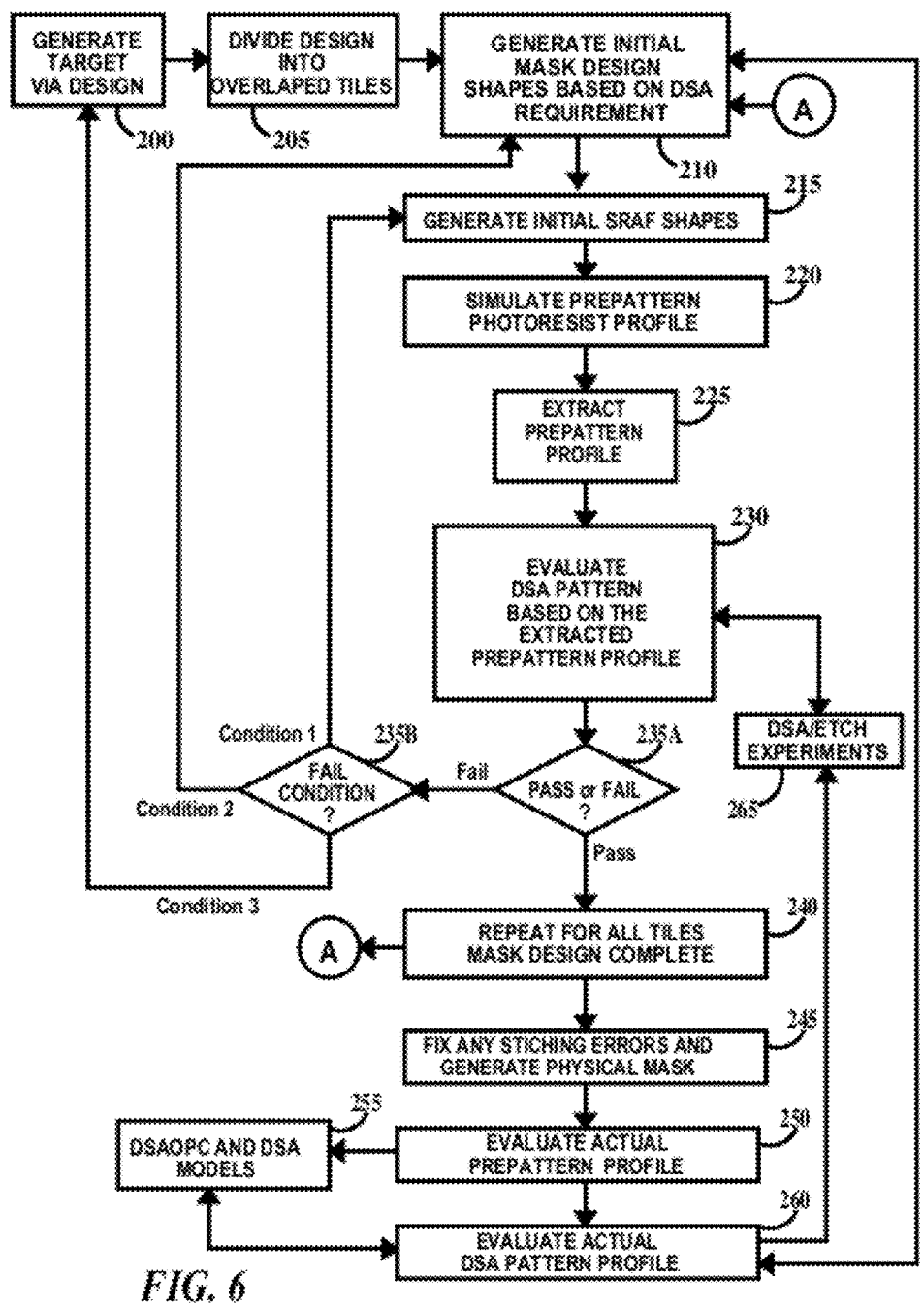
FIG. 6 is an exemplary flowchart of a method of designing photomasks for forming sub-resolution via features using directed self-assembly and optical lithography according to an embodiment of the present invention.

FIG. 6 is an exemplary flowchart of a method of designing photomasks for forming sub-resolution via features of integrated circuits using directed self-assembly and optical lithography according to an embodiment of the present invention. In step 200, a via design level of an integrated circuit is specified in a design shapes file. The design shapes file includes target via shapes. The design shapes file specifies via dimensions and locations to be formed on a substrate after the combination of lithography and DSA processing across the entire chip. See, for example, the target via pattern of FIG. 5B.

Next in step 205, the full chip via design is divided into overlapping tiles and steps 210 through 245 are repeated for each tile. Tiling can be used because both the OPC and the DSA processes are local, involving interactions between adjacent or nearby features in the photomask or photoresist.

Next in step 210, an initial mask design shapes file based on DSA requirements is generated. Generation of initial mask shapes is based on a database of rules or principles. These principles would specify an initial prepattern (see, for example, the necked prepattern of FIG. 5B) and corresponding initial mask shape for each individual via or group of closely spaced vias on the tile. The corresponding initial mask shape would be one known or expected to produce the desired via profile after DSA processing, if the prepattern could be replicated in a photoresist layer with a high degree of fidelity by the optical lithographic process, at least for an isolated via or small group of vias. For example, an initial rule for DSA via shapes is that each via shape requires a circular DSA prepattern of radius larger (e.g., 2×-4×) than the via shape and centered at the via shape location.

Next in step 215, initial via sub-resolution assist features (SRAFs) are generated based on a set of rules. See, for example, the mask SRAF pattern of FIG. 5B. Via SRAFs may be either traditional SRAF structures or dimensionally adjusted mask shapes (e.g., mask shapes to which mask compensation has been applied) known to work well for DSAOPC.

Next in step 220, the photoresist prepattern profile is simulated using a model (for example: PROLITH program from KLA-Tencor) for the exposure and development processes. Multiple photoresist prepattern profiles may be generated corresponding to different variations of exposure, focus or process conditions. Specific exposure source/mask co-optimization (SMO) parameters are assumed by the model.

Next in step 225, the photoresist prepattern profile is extracted.

Next in step 230, for each (discrete or merged) photoresist prepattern a corresponding predicted via DSA pattern is generated and evaluated. Via DSA pattern evaluation may use any of the geometric heuristic algorithm of FIG. 10A, the database algorithm of FIG. 10B, or the simulation algorithm of FIG. 10C described supra. DSA patterns depend on various DSA parameters which include, but are not limited to, the composition of the self-assembled materials, prepattern surface properties and DSA process temperatures. Optionally, DSA patterns corresponding to the various DSA parameters may be considered and evaluated in step 230. The via DSA pattern prediction may include predicting the inner and outer domains of the via DSA pattern only or may be extended to further include modeling the topographical pattern resulting from selectively removing the inner domain of the via DSA pattern. If the inner domain (or the opening left behind after removing the inner domain) of the predicted via DSA pattern deviates from the target via shapes pattern (e.g., formation of additional undesired vias, merging of vias, missing vias), flag a violation and proceed to step 235A/B, otherwise determine the center of each via of the via DSA pattern and calculate an edge placement error (EPE) of DSA hole center to via design center. If the unsigned EPE error is greater than a specified overlay tolerance, flag a violation and proceed to step 235A/B.

Also in step 230, the DSA patterns are evaluated for number, dimension and location of the inner copolymer domains by comparison to the corresponding target via shapes. The evaluation may take the form of a test that is applied to determine if and to what degree of fidelity the directed self-assembly pattern will reproduce an opening in the self-assembly material that is within a specified range of a dimension of the target shape and a positional target on the substrate of the target shape. If the tile passes, the method proceeds to step 240, otherwise the method proceeds to step 235A/B. If no violations occur the method proceeds to step 240.

In step 240 the method proceeds through connector "A" to step 210 to process the next tile. If there are no further tiles, the method proceeds to step 245.

In step 235A/B, three paths are available depending upon the failure conditions. Condition (1): if the DSA pattern is not acceptable after less than n iterations of steps 215 through 230 then loop back to step 210 and modify the SRAF. Note n is a positive integer equal to greater than 2. Condition (2): if the DSA pattern is not acceptable after n iterations but less than m of steps 215 through 230 then loop back to step 210 and modify the SMO parameters. Note m is a positive integer equal to or greater than n+1. Condition (3): if the DSA pattern is not acceptable after m iterations of steps 215 through 230 then loop back to step 200 and modify the target via shapes.

In step 245, a stitching check of overlapping tiles is performed and further prepattern and/or DSA pattern optimization is performed in the tile overlap regions if needed. This is a process similar to steps 215 through 230. After fixing any stitching errors the mask design process is complete and a physical mask is fabricated.

However, optional steps 250 through 265 may be performed to verify the mask design and/or improve the DSA, DSAOPC and SMO models. Actual experimental data helps to verify and improve the DSAOPC models and the DSA models. The modification of the prepattern generation model and/or of the DSA pattern generation model has as its goal, reducing or minimizing differences between predicted DSA patterns and actual DSA patterns fabricated using photomasks having corresponding prepatterns.

In step 250, the actual photoresist prepattern profile from the exposure of actual DSAOPC mask design is compared with the predicted photoresist prepattern profiles and in steps 255 changes (if needed) to the DSAOPC and SMO models are made based on the actual experimental data.

In step 260, the actual DSA pattern is evaluated and compared with the predicted DSA pattern resulting from DSAOPC photoresist prepattern profile. Necessary changes are made to improve the DSA modeling process and DSAOPC process based on the actual DSA results in step 265.

Figure 7:
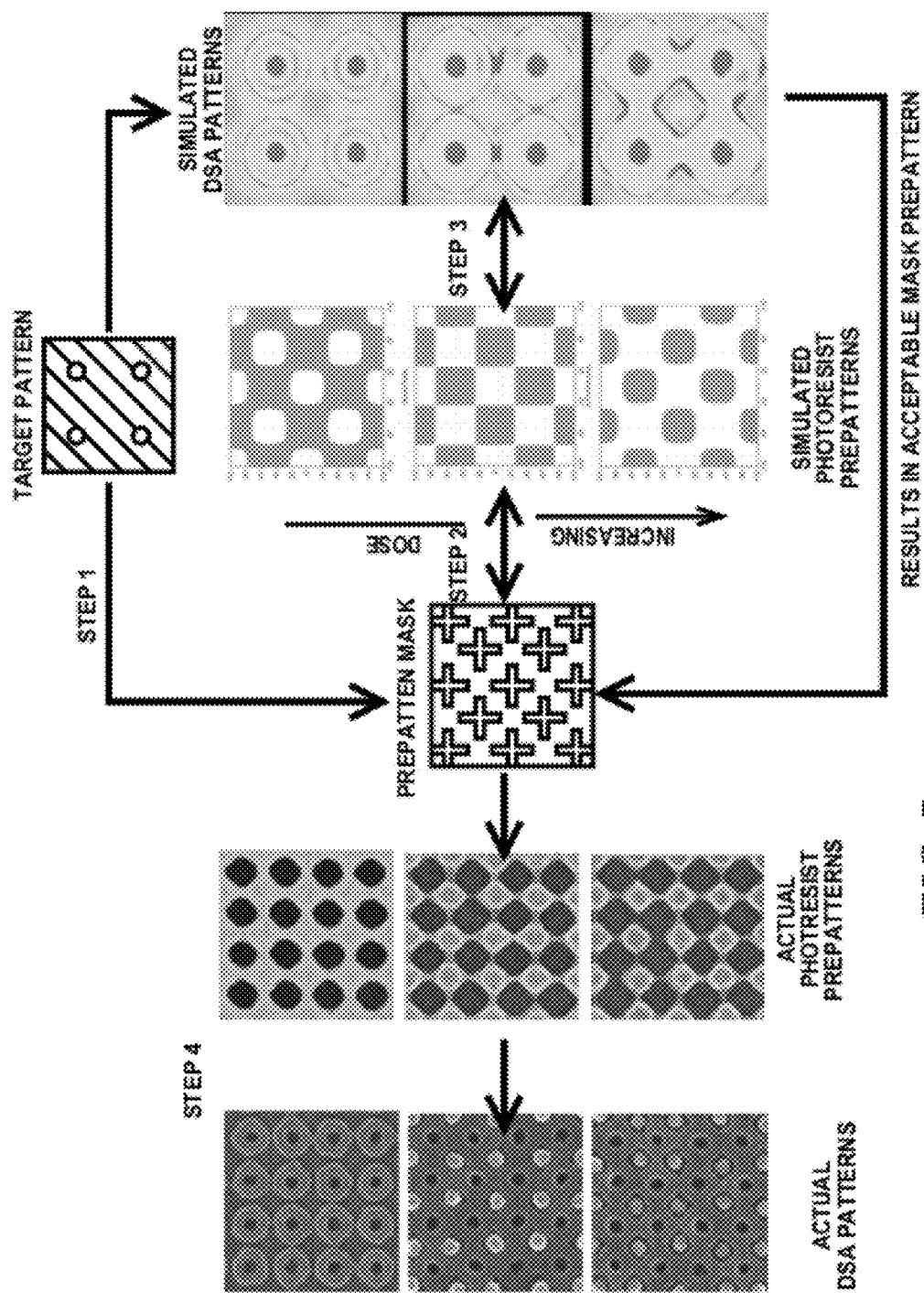
FIG. 7 is a schematic illustration of an exemplary actual implementation of a method of designing photomasks for generating prepatterns and resultant DSA patterns for forming sub-resolution via features of integrated circuits using directed self-assembly and optical lithography.

FIG. 7 is a schematic illustration of an exemplary actual implementation of a method of designing photomasks for generating prepatterns and resultant DSA patterns for forming sub-resolution via features of integrated circuits using directed self-assembly and optical lithography. A target via pattern, a computer-generated mask prepattern, three simulated photoresist prepatterns (at three different exposures) three corresponding simulated DSA patterns, three corresponding actual photoresist prepatterns and three actual DSA patterns are illustrated in FIG. 7.

In step 1, an initial mask design was created in view of directed self-assembly. (Initial patterns may be the same pattern as the target pattern.) In this example, a prepattern without DSAOPC was judged acceptable (see infra). However, if it had not been, after iterations, a DSAOPC pattern as illustrated would have been generated.

In step 2, a DSAOPC model was applied to the initial mask design to simulate the prepattern photoresist profiles in photoresist at different exposure doses. In the present example, a simulation that generates a prepattern of an array of vias under normal exposure conditions is illustrated. The mask printed diamond or square-shaped photoresist prepatterns that imparted adequate direction during the self-assembly of individual inner and outer copolymer domains. This is further illustrated in FIGS. 8 and 8A-through 8E.

In step 3, a DSA simulation was performed based on the simulated photoresist prepattern. Once the photoresist profile was generated, a computer implemented method was used to predict whether the resist profile will generate a DSA pattern yielding the final desired via geometry and placement. The process of self-assembly produces a pattern of inner and outer domains chemically enriched in one or more components of the self-assembly material (e.g., enriched in one polymer of a block copolymer). Selective etching or other processing transfers the DSA pattern into the underlying substrate. The domain sizes, shapes, characteristic patterns and pattern variability are properties of the specific self-assembly material and DSA process conditions. These properties can either be determined experimentally or derived from theory or simulation. With these properties in hand, it is possible to construct several different types of computer models to predict the DSA pattern given the resist geometry.

In step 4, the corresponding DSA patterns (step 3) from corresponding photoresist prepatterns exposed at a range of doses (step 2) were tested by comparing with the target pattern and found to be acceptable. In the present example the mask design was judged to provide acceptable exposure latitude and is therefore an acceptable final mask design. The actual physical mask fabricated using the final mask design of step 3 was used to image a 100 nm thick photoresist (JSR 3230) at the doses of 55 mJ/cm$^2$, 60 mJ/cm$^2$ and 65 mJ/cm$^2$ from top to bottom. The photoresist was exposed and baked to harden. The three SEM micrographs of the final (hardened) photoresist prepatterns show how the size of the prepatterns vary with dose. DSA patterns were generated by coating and baking a layer of the block copolymer PS-b-PMMA (96 kg/mol-35 kg/mol) on the hardened photoresist prepattern and baking at 200° C. for 5 minutes. The three SEM micrographs of the DSA patterns show acceptable size and location of the inner domains.

Three distinct computer implemented methods to predict a final DSA pattern given a resist profile and the characteristics of the self-assembling material as input including geometric heuristics, pattern matching, and direct simulations of the DSA process will be described.

The first computer implemented method ("neckwidth algorithm"), is a geometric heuristic algorithm derived from experimental observations. Experiments were carried out where a systematic series of dumbbell shaped prepattern profiles were generated on a substrate by overlapping two circles of varying radii and overlap distance. DSA processing was then applied and the final patterns evaluated by electron microscopy. The experiments revealed two basic criteria for the formation of a pair of well-separated vias after DSA processing. The first criterion was a characteristic range of radii that would result in formation of a single via over each circular lobe of the photoresist prepattern. If the radii are too small, no via is formed. If the radii are too large, multiple vias form. The second criterion was that the separation between the two circular lobes of the photoresist prepattern had to be large enough that a sufficiently narrow "neck" (narrowing of the resist profile along the line separating the circle centers) separated the two lobes. Based on these observations, a geometric heuristic algorithm that can be used to gauge whether a dumbbell-shaped prepattern will produce a desired DSA pattern was developed. The two criteria as applied in the algorithm are (1) verifying that the inscribed radii of the two lobes of the dumbbell are both of correct dimension for formation of inner domain in the self-assembly material and (2) verifying that the angular distance between the points of overlap of the two inscribed radii is smaller than a critical value. This algorithm is described in illustrated more fully in FIGS. 10A, 11A1, 11A2, 11B1, 11B1 and 11C and described infra.

A second computer implemented method for predicting the final DSA pattern is an empirical approach using a database of reference (e.g., photoresist) prepattern profiles linked with corresponding DSA patterns in a lookup-up table. The reference prepattern profiles can be stored in a database as data representing two- or three-dimensional geometrical objects. The corresponding DSA pattern for each stored reference prepattern profile can be determined by experiment or simulation of the DSA process and stored in the database in a similar format to form a look-up table. The database includes a sufficiently large number of reference prepattern profiles to capture the characteristic variations of shape, size and spacing explored in the mask design. Once the database is populated, a "database algorithm" can be used to predict the final DSA pattern from a candidate prepattern profile. In this algorithm the candidate prepattern profile is used to retrieve the closest matching reference prepattern profile and associated DSA pattern from the database. The closest matching reference prepattern profile is retrieved from the database by evaluating the geometric similarity of the candidate prepattern profile with each of the prepattern profiles in the database and selecting the most similar one. The associated DSA pattern is then evaluated against the target DSA pattern to see if it is acceptable. In cases where there is no adequately matching reference prepattern profile in the database, it would be advantageous to expand the database with one or more new reference prepattern profiles generated either by experiment or simulation. The database algorithm is illustrated in more detail in FIGS. 10B and 12 and described infra.

The third computer implemented method for predicting the final DSA pattern is to use a three-dimensional (3D) photoresist prepattern profile (e.g., see FIG. 8C) as the boundary condition for a direct, physical simulation of the self-assembly process ("molecular dynamics simulation algorithm"). The 3D prepattern profile is provided as input (FIG. 10, top) to a physical polymer simulation model, which uses it to define a simulation domain that is filled with a simulated homogenous and unstructured self-assembling material. Molecular dynamics or Monte Carlo methods subject the modeled material to physically realistic forces arising from both intra-self-assembly material and material-photoresist interactions and allow the DSA pattern to evolve in a physically realistic process. For example, Monte Carlo simulations were used to explore the effects of substrate topography on the alignment of lamellar phase block co-polymers confined within a narrow channel ("Directed Self-Assembly of Lamellar Microdomains of Block Copolymers Using Topographic Guiding Patterns", Sang-Min Park, Charles T. Rettner, Jed W. Pitera and Ho-Cheol Kim, Macromolecules v42 n15 p 5895-5899, 2009).

Alternatively, analytical polymer field theory methods can be used to directly determine the most probable DSA pattern given an input photoresist prepattern geometry. Regardless of the method, a converged simulation yields a physically realistic, experimentally validated 3D profile of the material components that make up the SA material (see the top three images of FIG. 9) which can then be used as the predicted final DSA pattern or treated with a model of a selective etching process to yield a prediction of the final DSA pattern after etching (see "Oxygen plasma removal of thin polymer films", G. N. Taylor and T. M. Wolf, Polymer Engineering and Science v 20 n 16 p 1087-1092, 1979). The specific etching model implemented is described in step 480 of FIG. 10C. Each photoresist prepattern is subjected to the same simulation protocol, and only those prepatterns that closely produce the desired final DSA pattern after simulation are acceptable. Both molecular dynamics and Monte Carlo computer programs were developed to carry out the simulations described above on a parallel computer system and used to model the DSA process within both "dumbbell" and "checkerboard" prepatterns over a wide range of shape, size, and spacing variations. A computer program to model the etching process and produce a predicted etched pattern from the simulation results was also developed. The simulation algorithm, in both molecular dynamics and Monte Carlo forms, is described in more detail in reference to FIG. 10C and described infra.

FIGS. 8, 8A, 8B, 8C, 8D and 8E illustrate integrating DSA process characteristics into a mask design for forming sub-resolution features using directed self-assembly and optical lithography for step 2 of FIG. 7. FIG. 8 illustrates a target via pattern. FIG. 8A illustrates the mask (mask shapes) for the target vias of FIG. 8. The mask shapes are a cross pattern made from 90 degree overlapped narrow bars 22 nm wide and 72 nm in length (for the example of FIG. 7). 22 nm wide features are sub-resolution features. FIGS. 8B and 8D are simulated two-dimensional photoresist profiles and FIGS. 8C and 8D are simulated corresponding three-dimensional photoresist profiles of the upper and lower examples of FIG. 7. FIGS. 8B and 8C show, respectively, two-dimensional and three-dimensional simulated resist patterns of 53 nm via arrays.

Figure 9:
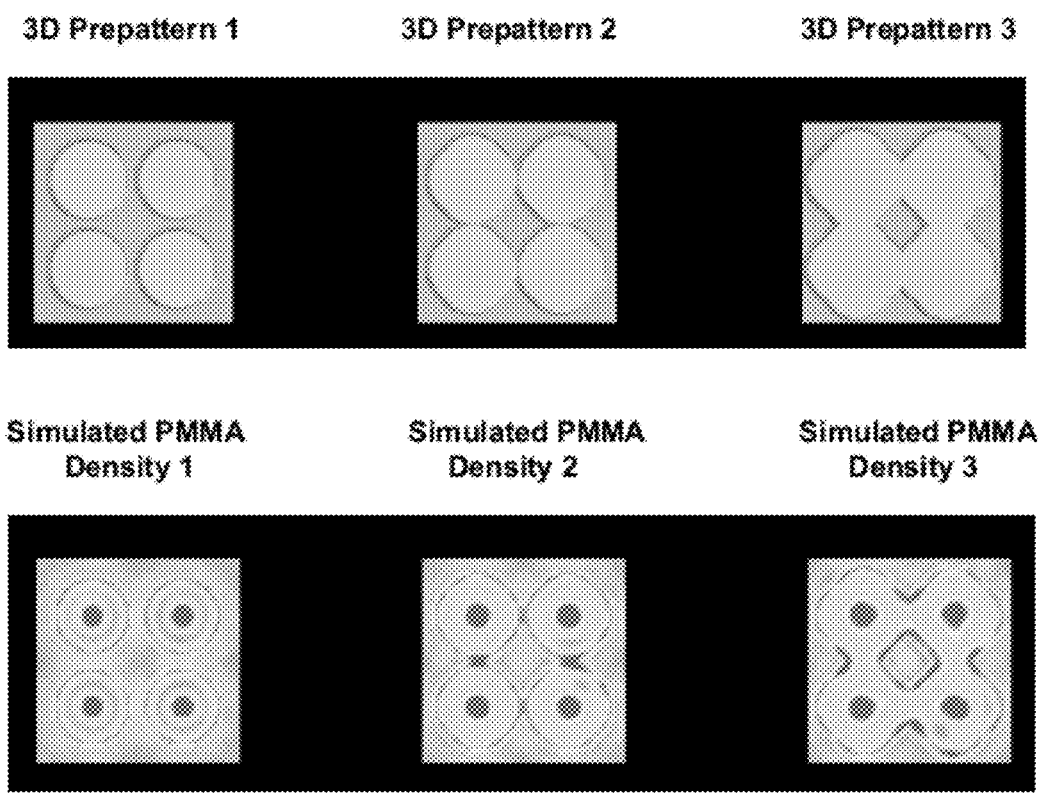
FIG. 9 illustrates an exemplary prediction of DSA patterns from a corresponding prepattern.

FIG. 9 illustrates an exemplary prediction of DSA patterns from a corresponding prepattern. The prepatterns were derived from FIG. 8. The images in FIG. 9 were generated from Monte Carlo simulations of a cylinder-forming AB diblock copolymer simulated in the presence of a set of four prepattern holes of different sizes and shapes. The AB diblock copolymers were modeled as chains 24 beads in length with A volume fraction f=0.33 (i.e., 8 A beads/chain). The equilibrium bond length between successive beads was 2.93 nm. The monomer number density was 20/nm$^3$, compressibility κ=25 and Flory-Huggins parameter $\chi_{AB}$=1.0. The prepatterns were modeled as a solid uniform density "C" selective for the A beads ($\chi_{AC}$=0.0, $\chi_{BC}$=1.0) with four circular or rounded square holes.

In FIG. 9, three prepatterns (top row) are derived from the simulation result from FIG. 8 and the prepattern vias range from discrete patterns, through connected patterns, to merged patterns. All three predictions of DSA patterns (bottom row) for the corresponding prepattern (top row), show four DSA vias which are very close to the target via design. The predictions indicate that the DSA process has high tolerance of the variation in the prepattern shapes and yield DSA vias within the acceptable range.

Figures 10A, 10B, 10C:
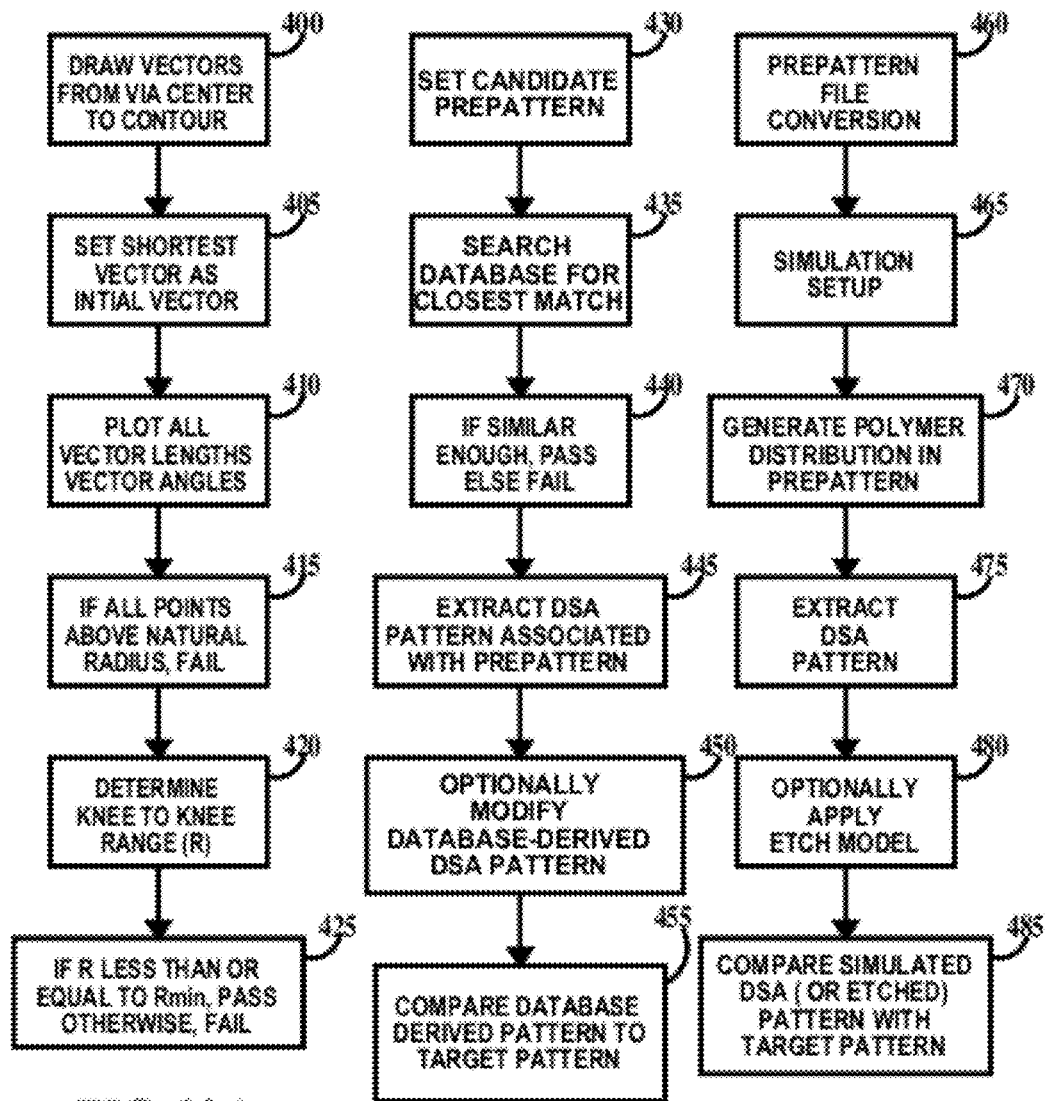
FIG. 10A is a flowchart of a geometric heuristics algorithm for DSA pattern simulation and testing according to an embodiment of the present invention.
FIG. 10B is a flowchart of a database algorithm for DSA pattern simulation and testing according to an embodiment of the present invention.
FIG. 10C is a flowchart of a simulation algorithm for DSA pattern simulation and testing according to an embodiment of the present invention.

FIG. 10A is a flowchart of a geometric heuristics algorithm for DSA pattern simulation and testing according to an embodiment of the present invention. In step 400, a prepattern contour is made up of intersecting circles with the overlapping segments of each circle removed. (See FIGS. 11A1, 11A2 and 11A3). A set of vectors are swept from a center of a circular segment of the prepattern contour to intersect the contour at multiple preset angles. The center of the circular segment is also the center of a target via. A shortest vector that intersects the resist pattern is set as initial vector (e.g., V1 of FIG. 11A1). The initial angle and the initial length of the initial vector are recorded.

Next, in step 405, for all angles separated by a predetermined interval from the initial angle, a vector is extended to intersect with the nearest photoresist edge. All the vector lengths and angles are recorded.

Next, in step 410, all vector lengths are plotted as a function of the associated angle. Angles range between 0° and 360°.

Next in step 415, if the whole curve is above a constant called the natural radius (Rnat, see FIG. 11C) which is a constant calibrated from the DSA process, flag a pass else flag a fail, and then proceed to step 420. Rnat is a function of the composition of the SA material and prepattern surface properties. Therefore a pass using a first SA material may be a fail using a second SA material and vice versa.

Next in step 420, the knee positions of the curve (which are sharp changes in the slope of the curve greater than a preset value) are determined. In FIG. 11A3 these are the positions between which R1 and R2 are measured.

Finally, in step 425, the knee to knee angle (R) is determined and if R is less than or equal to a value Rmin (a constant calibrated from the DSA process), flag a pass, else flag a fail.

Figure 12:
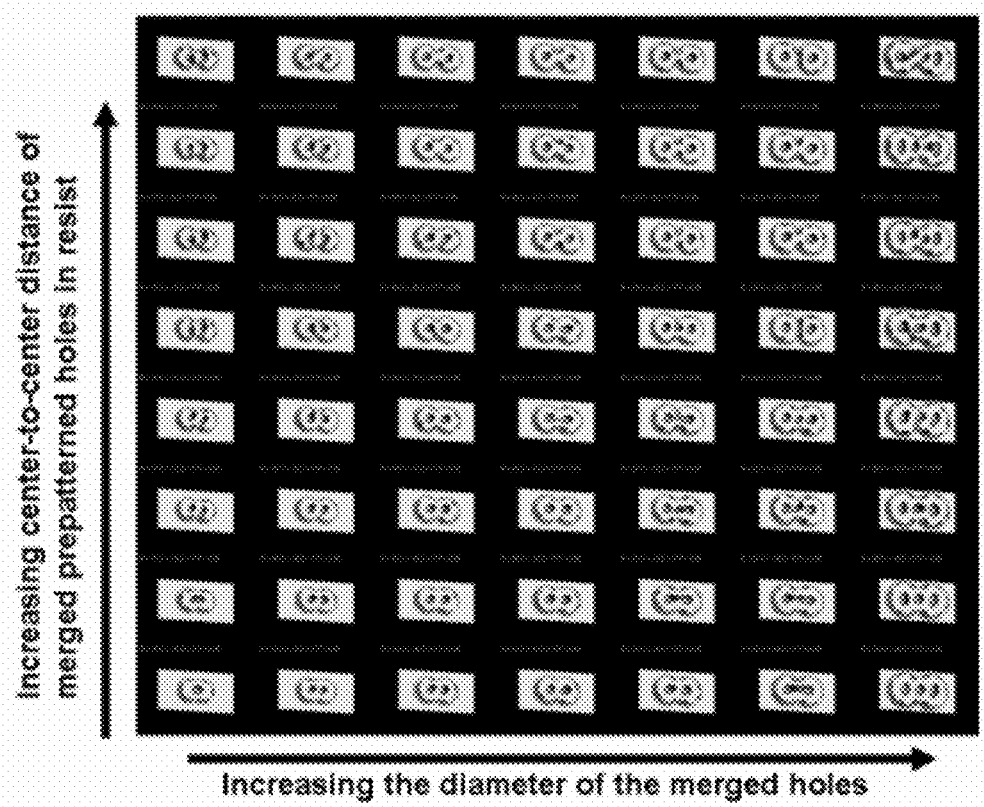
FIG. 12 illustrates a lookup table for the DSA database algorithm and testing of FIG. 10B.

FIG. 10B is a flowchart of a database algorithm for DSA pattern prediction and testing according to an embodiment of the present invention. This algorithm makes use of a database of reference prepattern profiles (stored as 2D or 3D geometric objects) with their associated corresponding DSA patterns. The database is used as a lookup table to find the DSA pattern that approximately corresponds to the current candidate prepattern profile. A lookup table (shown as a graphical display) based on the simulation is illustrated in Table 1 of FIG. 12. Resultant DSA patterns depend on DSA parameters that include, but are not limited to, the composition of the DSA material and prepattern surface properties. The lookup table of FIG. 12 illustrates DSA patterns resulting from a specific SA material and surface properties of a specific prepattern material. Therefore, multiple lookup tables corresponding to the various DSA parameters may be used.

In step 430, an initial prepattern profile is selected as a candidate prepattern profile and (if necessary) the current candidate prepattern profile is converted into the same object format as the stored photoresist profiles.

Next in step 435, the database is searched to find the reference prepattern profile most geometrically similar to the candidate prepattern profile. For example:

(1) Filter the database to create a list of reference prepattern profiles of size similar to the candidate profile.

(2) For each reference prepattern profile in the list, superimpose the reference prepattern profile with the current prepattern profile (by rotation and/or translation) and calculate the overlap similarity (S) between the superimposed reference prepattern profile and the candidate prepattern profile. S=(area of overlap) divided by the square root of (the area of reference prepattern profile times the area of current prepattern profile).

(3) Select the reference prepattern profile with the highest similarity (value of S) to the candidate prepattern profile.

Next in step 440, if the selected prepattern profile does not have high similarity (S greater than equal to about 0.8) to the candidate prepattern profile (based on a minimum sufficient threshold of similarity) an error is flagged and the process stops. In this case the database may need to be expanded by additional experiments or simulations to generate records of reference prepatterns profiles with greater similarity to the candidate prepattern profile.

Next in step 445, the DSA pattern associated with the selected reference prepattern profile is extracted from the database.

Next in step 450, optionally the database-derived DSA pattern is filtered by superimposing it on the selected prepattern profile (using the rotation and/or translation determined for the reference prepattern profile in step 440), masking out areas where the selected prepattern profile overlaps with the DSA pattern and expanding regions where the candidate prepattern profile is larger than the DSA pattern.

Finally in step 455, the database-derived DSA pattern is compared against the target via pattern as to size and position of the inner domain and any errors greater than preset limits determined; flagging any violations found.

FIG. 10C is a flowchart of a simulation algorithm for DSA pattern simulation and testing according to an embodiment of the present invention. This algorithm makes use of a self-assembly block copolymer or self-assembly material simulation program to carry out a direct numerical simulation of the physical process of self-assembly in the presence of a candidate prepattern profile (e.g., photoresist prepattern profile), yielding a corresponding simulated DSA pattern. Before describing the method the terms FENE bond, Flory-Huggins miscibility parameter and Metropolis-Hastings rule will be discussed.

FENE (finite extensible nonlinear elastic) bond is a standard mathematical model of the forces that act between successive segments (groups of monomers) along a polymer chain. It attempts to mathematically model the forces that arise from the covalent chemical bonds that connect the polymer chain. The energy of a FENE bond increases harmonically with small displacements, but as it is stretched further it becomes infinite at a critical distance Rc, preventing the bond from being stretched beyond that length.

The Flory-Huggins miscibility parameter (often written with the Greek letter chi) is a measure of the propensity for two chemical species to mix or separate. It represents the energy difference between a homogenous mixture of two chemical species (e.g., a mixture of polystyrene and polymethyl methacrylate) versus the separated species (one container of polystyrene and another of poly-methyl methacrylate). If the Flory-Huggins parameter is negative, the two components tend to mix; if it is positive, the two components tend to separate. This parameter captures the main driving force that creates domains that constitute DSA patterns during self-assembly.

The Metropolis-Hastings acceptance rule is a procedure for stochastically sampling from an unknown distribution function (probability) when only the distribution function ratio is known. More simply, it provides a recipe for accepting or rejecting trial moves in a Monte Carlo procedure when it is only possible to know the relative probabilities of the trial and current moves (the probability ratio). The trial move is automatically accepted if its probability is greater than that of the current move ($P\_trial/P\_current > 1$). If the trial move is less probable than the current move ($P\_trial/P\_current < 1$), a stochastic procedure is used. A random number between 0 and 1 is generated, and if the random number is less than the ratio $P\_trial/P\_current$, the trial move is accepted. Otherwise, the current move is retained.

Monte Carlo methods are a class of computational algorithms that rely on repeated random sampling to compute their results. Because of their reliance on repeated computation of random or pseudo-random numbers, these methods are most suited to calculation by a computer and tend to be used when it is unfeasible or impossible to compute an exact result with a deterministic algorithm. A stochastic model describes a system by taking into account chance events as well as planned events.

Returning to FIG. 10C, in step 460, if necessary, a candidate photoresist profile is converted into a geometric format (e.g., from a 2D line object to 3D scalar field) suitable for the simulation program of step 465.

Next in step 465, the prepattern profile (e.g., simulated photoresist prepattern) is filled with an unstructured, random arrangement of molecules of the SA material at a density and composition comparable to experiment. For example, the following loop may be used:

(1) While the density of molecules is less than the experimental value;

(2) generate a random geometry for a molecule of the self-assembling material;

(3) randomly place the molecule geometry in the prepattern profile, such that it does not overlap the edges of the profile;

(4) calculate a new density and start the next iteration at (1); and (5) continue until a match with experiment is obtained.

Next in step 470, the arrangement of molecules generated in step 470 is subjected to a physical simulation protocol, such as molecular dynamics or Monte Carlo, using a mathematical model that accurately captures the intra- and intermolecular forces of the self-assembling material as well as the interactions between the self-assembling material and the resist material (e.g., harmonic or FENE spring bonds combined with inter-site contact energies based on Flory-Huggins miscibility parameters). In a typical model, each polymer is represented by a chain of interaction sites or "beads", where each bead represents a statistical segment (several monomers) of the real polymer. Soft harmonic "springs" between successive "beads" connect them together to form the polymer chain. The beads also interact with one another by "nonbonded" interactions that act between all pairs of beads, regardless of whether they belong to the same or different polymer molecules. One of the non-bonded terms is a mix of repulsive and attractive forces that controls the density of the system and its compressibility (density fluctuations). Regions where the polymer deviates from the experimental density experience an energy penalty that forces them back toward the experimental density. A copolymer or blend can be modeled by assigning different types to different "beads" (e.g., PS beads could be type 1 and the PMMA beads could be type 2), and introducing a repulsive non-bonded interaction between dissimilar types (often associated with the Flory-Huggins $\chi$ miscibility parameter). The composition of SA materials can be varied at this stage. This repulsive force can cause the two components of the copolymer to spontaneously segregate from one another in the simulation, yielding a pattern of self-assembly domains. The non-bonded interactions can either be modeled in terms of a pair potential acting between beads or as a functional of the bead density distribution.

In a molecular dynamics simulation, the movement of the polymer beads is followed by simulating Newton's equations of motion. Each bead has a velocity and the forces acting on the beads alter their velocities, driving them away from unfavorable (high energy) regions and toward favorable (low energy) ones. The velocities are used to iteratively update the positions of the beads, producing a time series "movie" of the polymers as they self-assemble. In contrast, the Monte Carlo simulation uses a pseudorandom number sequence to generate "trial moves"—translations or rotations of one or more beads, producing a new set of trial coordinates. The energy of the trial coordinate set is evaluated and compared with the energy of the current coordinate set, then accepted or rejected with a Metropolis-Hastings acceptance rule. Trial moves that lower the energy of the system are accepted, while those that raise the energy too much tend to be rejected. Like the forces in the molecular dynamics simulation, this process tends to move polymers out of unfavorable high energy regions and into favorable ones until the system reaches equilibrium. This rearrangement of the system based on energetic and entropic driving forces is what leads to the observed phase separation and self-assembly in the simulation. With either simulation algorithm, the physical simulation is continued until the distribution of self-assembly material in the simulation volume is stationary. Annealing, tempering, or other sampling methods may be used to accelerate convergence, but the final state of the simulation needs to be representative of the experimental DSA process.

Next in step 475, the distribution of self-assembly material is extracted from the final state of the physical simulation. The physical simulation volume is subdivided into small volume elements, and the local density of each material type in each volume element is calculated, either by counting the beads of that type which lie in the volume element or by using the bead centers as kernel locations for a kernel density approximation.

Next in step 480, optionally, an etching model is applied to the simulated DSA pattern. An etching model simulates a physical etching process where the different components of the SA material are removed at different rates to yield a simulated etched DSA pattern. For example, a top-down vertical etching of a two-component DSA system can be modeled by the following:

(1) Divide the DSA pattern into square vertical columns approximately 1 nm×1 nm in cross section.
(2) Loop over N etching steps. For each etching step:
   (a) Loop over the vertical columns. For each column:
      (i) Check the current height of the column.
      (ii) Based on the local composition of material at the top of the column, estimate the probability of etching ~1 nm of material from the top of the column during the current etching step
      (iii) Generate a random number on [0,1].
      (iv) If the random number is <=the etch probability, lower the height of the column by ~1 nm.
(3) Output an "etched" DSA pattern where the original DSA pattern is vertically truncated at the height of each column.

In step 485, the simulated DSA pattern or simulated etched pattern is compared against the target via pattern as to size and position of the inner domain. Any differences greater than preset limits are flagged as violations.

FIGS. 11A1, 11A2, 11A3 illustrate the principle of minimum radius of the first algorithm for DSA pattern simulation and testing of FIG. 10A. In FIG. 11A1, a merged prepattern consists of circular joined circular segments 500A and 500B centered respectively on centers 505A and 505B. Exemplary vectors V1, V2, V3 and V4 are swept from center 505A to the contour. The angular range between vectors V1 and V4 (these are the vectors to the intersections of segments 500A and 500B) is R1. The simulated positions of vias 510A and 510B are shown. These positions agree well with the centers 505A and 505B. A curve of the vector lengths and corresponding angles is plotted as the curve "PASS" in FIG. 11A3.

In FIG. 11A2, exemplary vectors V5, V6, V7 and V8 are swept from center 520A to the contour. The angular range between vectors V5 and V8 (these are the vectors to the intersections of segments 515A and 515B) is R2. The simulated positions of vias 525A, 525B and 525C are shown. These positions do not agree well with the centers 520A and 520B and there is one too many via. A curve of the vector lengths and corresponding angles is plotted as the curve "FAIL" in FIG. 11A3.

In FIG. 11A3, it can be seen that R1 is less than Rmin (passes), and R2 is greater than Rmin (fails).

FIGS. 11B1 and 11B2 illustrate the principle of minimum radius of the first algorithm for DSA pattern simulation and testing of FIG. 10A extended to three vias in an "L" shape. In FIG. 11B1 three circular segments of a merged prepattern were swept from corresponding centers marked by "+"s. Two intersections were formed having respective angular ranges R3 and R4. The simulated positions of vias 530A, 530B and 530C are shown. These positions agree well with the corresponding centers, and both R3 and R4 would be found to be less than or equal to Rmin.

In FIG. 11B2 three circular segments of a merged prepattern were swept from corresponding centers marked by "+"s. Three intersections were formed having respective angular ranges R5, R6 and R7. The simulated positions of vias 535A, 535B, 535C and 535D are shown. These positions do not agree well with their corresponding centers, and at least one of R5, R6 or and R7 would be found to be less than or equal to Rmin. Further, there is one too many vias.

FIG. 11C illustrates the principle of natural radius of the first algorithm for DSA pattern simulation and testing of FIG. 10A. In FIG. 11C, a first curve 540 has two regions of 540A and 540B of constant vector length with changing angle surrounding a middle region 540C of changing vector length with changing vector angle. The regions of constant length 540A and 540B occur at a value Rmin(1). A second curve 545 has two regions of 545A and 545B of constant vector length with changing angle surrounding a middle region 545C of changing vector length with changing vector angle. The regions of constant length angle 545A and 545B occur at a value Rmin(2). Also shown in FIG. 11C is a dashed line 550 of constant vector length with changing vector angle. A vector angle value Rnat is associated with dashed line 550. Rnat may be derived by simulation or experimentally. When regions of a plot of vector angle versus vector length having a constant length with changing angle are greater than Rnat (as in curve 540), a prepattern derived from intersecting circular segments will generate the desired via pattern (Pass). Expressed another way, a Pass occurs when the entire curve of a plot of vector angle versus vector length is above Rnat. When regions of a plot of vector length versus vector angle having a constant length with changing angle are less and or equal to Rnat (as in curve 545), a prepattern derived from intersecting circular segments will not generate the desired via pattern (Fail). Expressed another way, a Fail occurs when any part of a curve of vector angle versus vector length is touches or is below Rnat.

The ability to predict the suitability of prepatterns for DSA processes by analyzing the lengths and angles of vectors sweeping the contour of a prepattern against target values Rmin and Rnat is an unexpected and useful result as it allows, for example, automation of the mask design process.

FIG. 12 illustrates a lookup table for the DSA database algorithm and testing of FIG. 10B. In FIG. 12, a lookup table for prepatterns of two intersecting circular segments for forming one, two or three vias is illustrated. Along the Y axis, the center-to-center distance of the merged prepattern increases and along the X-axis, the diameter of the holes (i.e., radius of the circular segments) of the prepattern increases. The method described herein with respect to method for designing optical lithography masks for directed self-assembly may be practiced with a general-purpose computer and the methods described supra in the flow diagrams of FIGS. 4, 6, 10A, 10B, and 10C may be coded as a set of instructions on removable or hard media for use by the general-purpose computer.

Figure 13:
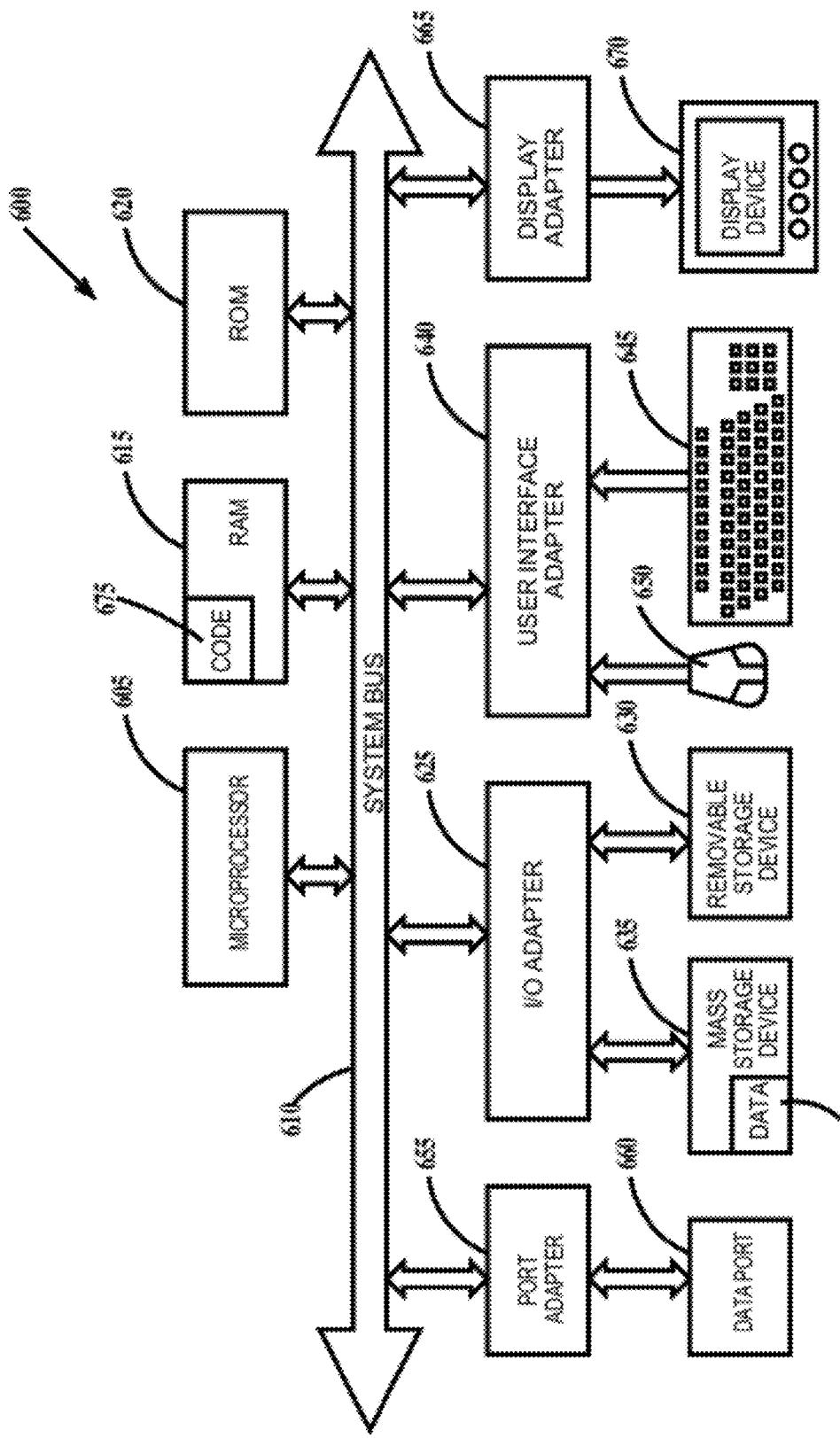
FIG. 13 is a schematic block diagram of a general-purpose computer.

FIG. 13 is a schematic block diagram of a general-purpose computer. In FIG. 13, computer system 600 has at least one microprocessor or central processing unit (CPU) 605. CPU 605 is interconnected via a system bus 610 to a random access memory (RAM) 615, a read-only memory (ROM) 620, an input/output (I/O) adapter 625 for a connecting a removable data and/or program storage device 630 and a mass data and/or program storage device 635, a user interface adapter 640 for connecting a keyboard 645 and a mouse 650, a port adapter 655 for connecting a data port 660 and a display adapter 665 for connecting a display device 670.

ROM 620 contains the basic operating system for computer system 600. The operating system may alternatively reside in RAM 615 or elsewhere as is known in the art. Examples of removable data and/or program storage device 630 include magnetic media such as floppy drives and tape drives and optical media such as CD ROM drives. Examples of mass data and/or program storage device 635 include electronic, magnetic, optical, electromagnetic, infrared, and semiconductor devices. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 645 and mouse 650, other user input devices such as trackballs, writing tablets, pressure pads, microphones, light pens and position-sensing screen displays may be connected to user interface 640. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 630, fed through data port 660 or typed in using keyboard 645.

While the methods described supra are based on prepatterns formed in photoresist layers, the methods may be extended to prepatterns formed in a hardmask (e.g., a silicon oxide layer or silicon nitride layer) where the photoresist prepattern has been transferred to the hardmask layer using the photoresist prepattern as an etch mask for the hardmask layer. The methods may also be extended to prepatterns in a bottom anti-reflective coating (BARC) (e.g., a layer of anti-reflective material between the photoresist layer and the substrate) where the photoresist prepattern has been transferred to the BARC using the photoresist prepattern as an etch mask for the BARC. When hardmask or BARC prepatterns are used, the methods may include compensating the design of the mask prepattern shape to account for etch bias of the etching process (e.g., applying compensation between steps 210 and 215 of FIG. 6 to the mask design shapes.)

Thus, embodiments of the present invention provide a method to for designing masks usable in a process for forming sub-resolution features (including sub-resolution via features) of integrated circuits using directed self-assembly and optical lithography.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of designing an optical photomask for forming a prepattern opening in a photoresist layer on a substrate wherein said photoresist layer and said prepattern opening are coated with a self-assembly material that undergoes directed self-assembly to form a directed self-assembly pattern, comprising:
(a) generating a mask design shape from a target design shape;
(b) generating an optical proximity corrected sub-resolution assist feature design shape based on said mask design shape;
(c) using a computer, generating a prepattern design shape based on said optical proximity corrected sub-resolution assist feature design shape and generating a predicted directed self-assembly pattern based on said prepattern design shape; and
(d) comparing dimensions and position of said predicted directed self-assembly pattern to specified ranges of dimensional and positional targets of said target design shape.

2. The method of claim 1, wherein (d) includes determining when said predicted directed self-assembly pattern includes an inner domain surrounded by an outer domain: and
(e) when said inner domain is not within said specified ranges of said dimensional and positional targets of said target design shape; either
(f) adjusting said sub-resolution assist feature design shape and repeating (b) through (d) until said inner domain is within said specified ranges of dimensional and positional targets of said target design shape or repeating (b) through (d) a predetermined number of times; or
(g) adjusting said predicted directed self-assembly pattern and repeating (c) and (d) until said inner domain is within said specified ranges of dimensional and positional targets of said target design shape or repeating (c) and (d) a predetermined number of times.

3. The method of claim 1, wherein said comparing dimensions and position of said predicted to specified ranges of dimensional and positional targets of said target design shape is performed using a geometric heuristic algorithm.

4. The method of claim 3, wherein said geometric heuristic algorithm includes:
(i) determining centers of at least two target via design shapes of said target design shape, said at least two target via design shapes being spaced apart;
(ii) constructing a contour of joined and non-overlapping segments of corresponding intersecting circles centered on said centers, said segments having radii greater than radii of said target via shapes;
(iii) projecting a set of vectors from a center of one of said at least two target via design shapes to said contour over a range of 0° to 360°;
(iv) generating a curve of vector angle versus vector length; and either
(v) selecting said initial mask design shape when an angular range of vector angles of regions of said curve that do not have a constant vector length are less than a predetermined angular range else changing radii of one or more of said circles and repeating (ii), (iii) and (iv) until either said angular range of vector angles of regions of said curve that do not have a constant vector length are greater than or equal to said predetermined angular range or (vi) until (ii), (iii) and (iv) have been repeated a predetermined number of times; or
(vii) selecting said initial directed self-assembly mask design shape when all vector lengths of said curve are greater than a predetermined minimum length else either changing radii of one or more of said circles and repeating (ii), (iii) and (iv) until all vector lengths of said curve are greater than a predetermined minimum length or (viii) until (ii), (iii) and (iv) have been repeated a predetermined number of times.

5. The method of claim 1, wherein a molecular dynamics simulation is used by said computer to generate said predicted directed self-assembly pattern.

6. The method of claim 1, wherein a look-up table of different directed self-assembly patterns of said self-assembly material and corresponding prepatterns is used by said computer to generate said predicted directed self-assembly pattern.

7. The method of claim 1, further including:
(e) determining if when said predicted directed self-assembly pattern includes and inner and an outer domain, determining if dimensions and position of said inner domain is within said specified ranges of said dimensional and positional targets of said target shape.

8. The method of claim 1, wherein (c) includes performing an exposure source/mask co-optimization in generating said prepattern design shape.

9. The method of claim 1, further including:
(e) modifying said prepattern design shape generation, said predicted directed self-assembly pattern generation or both said prepattern design shape generation and said predicted directed self-assembly pattern generation to reduce any difference between said predicted directed self-assembly pattern and an actual directed self-assembly pattern fabricated using a photomask having said prepattern design shape.

10. The method of claim 1, further including:
generating a simulated prepattern photoresist profile using said prepattern design shape, and generating a predicted directed self-assembly pattern using said simulated prepattern photoresist profile.

11. A computer system comprising a processor, an address/data bus coupled to said processor, and a computer-readable memory unit coupled to communicate with said processor, said memory unit containing instructions that when executed by the processor implement a method for designing an optical photomask for forming a prepattern opening in a photoresist layer on a substrate wherein said photoresist layer and said prepattern opening are coated with a self-assembly material that undergoes directed self-assembly to form a directed self-assembly pattern, said method comprising the computer implemented steps of:
(a) generating a mask design shape from a target design shape;
(b) generating an optical proximity corrected sub-resolution assist feature design shape based on said mask design shape;
(c) generating a prepattern design shape based on said optical proximity corrected sub-resolution assist feature design shape and generating a predicted directed self-assembly pattern based on said prepattern design shape; and
(d) comparing dimensions and position of said predicted directed self-assembly pattern directed self-assembly pattern to specified ranges of dimensional and positional targets of said target design shape.

12. The computer system of claim 11, wherein the method step (d) includes determining when said predicted directed self-assembly pattern includes an inner domain surrounded by an outer domain; and
(e) when said inner domain is not within said specified ranges of said dimensional and positional targets of said target design shape; either
(f) adjusting said sub-resolution assist feature design shape and repeating method steps (b) through (d) until said inner domain is within said specified ranges of dimensional and positional targets of said target design shape or repeating method steps (b) through (d) a predetermined number of times; or
(g) adjusting said predicted directed self-assembly pattern and repeating method steps (c) and (d) until said inner domain is within said specified ranges of dimensional and positional targets of said target design shape or repeating method steps (c) and (d) a predetermined number of times.

13. The computer system of claim 11, wherein the method step of comparing dimensions and position of said predicted to specified ranges of dimensional and positional targets of said target design shape is performed using a geometric heuristic algorithm.

14. The computer system of claim 13, the method step (a) including:
(i) determining centers of at least two target via design shapes of said target design shape, said at least two target via design shapes being spaced apart;
(ii) constructing a contour of joined and non-overlapping segments of corresponding intersecting circles centered on said centers, said segments having radii greater than radii of said target via shapes;
(iii) projecting a set of vectors from a center of one of said at least two target via design shapes to said contour over a range of 0° to 360°;
(iv) generating a curve of vector angle versus vector length; and either
(v) selecting said initial mask design shape when an angular range of vector angles of regions of said curve that do not have a constant vector length are less than a predetermined angular range else changing radii of one or more of said circles and repeating method steps (ii), (iii) and (iv) until either said angular range of vector angles of regions of said curve that do not have a constant vector length are greater than or equal to said predetermined angular range or (vi) until method steps (ii), (iii) and (iv) have been repeated a predetermined number of times; or
(vii) selecting said initial directed self-assembly mask design shape when all vector lengths of said curve are greater than a predetermined minimum length else either changing radii of one or more of said circles and repeating method steps (ii), (iii) and (iv) until all vector lengths of said curve are greater than a predetermined minimum length or (viii) until method steps (ii), (iii) and (iv) have been repeated a predetermined number of times.

15. The computer system of claim 11, wherein the method step of generating said predicted self-assembly pattern uses a molecular dynamics simulation.

16. The computer system of claim 11, wherein the method step of generating said self-assembly pattern uses a look-up table of different directed self-assembly patterns of said self-assembly material and corresponding prepatterns to generate said predicted self-assembly pattern.

17. The computer system of claim 11, method step (c) further including:
(e) modifying said prepattern design shape generation, said predicted directed self-assembly pattern generation or both said prepattern design shape generation and said predicted directed self-assembly pattern generation to reduce any difference between said predicted directed self-assembly pattern and an actual directed self-assembly pattern fabricated using a photomask having said prepattern design shape.

18. The computer system of claim 11, the method step (c) further including:
generating a simulated prepattern photoresist profile using said prepattern design shape, and generating a predicted directed self-assembly pattern using said simulated prepattern photoresist profile.

* * * * *